US009620761B2

United States Patent
Smith et al.

(10) Patent No.: US 9,620,761 B2
(45) Date of Patent: *Apr. 11, 2017

(54) BATTERY CELL INTERCONNECT AND VOLTAGE SENSING ASSEMBLY AND A BATTERY MODULE

(71) Applicant: LG Chem, Ltd., Seoul (KR)

(72) Inventors: Alexander Jeffrey Smith, White Lake, MI (US); Robert Merriman, Shelby Township, MI (US); Heekook Yang, Troy, MI (US); Michael P. Garascia, Waterford, MI (US); Mark W. Axler, Troy, MI (US)

(73) Assignee: LG Chem, Ltd., Seoul (KR)

( * ) Notice: Subject to any disclaimer, the term of this patent is extended or adjusted under 35 U.S.C. 154(b) by 424 days.

This patent is subject to a terminal disclaimer.

(21) Appl. No.: 14/480,666

(22) Filed: Sep. 9, 2014

(65) Prior Publication Data

US 2016/0072112 A1  Mar. 10, 2016

(51) Int. Cl.
*H01M 10/48* (2006.01)
*H01M 2/20* (2006.01)
(Continued)

(52) U.S. Cl.
CPC ......... *H01M 2/202* (2013.01); *H01M 2/1016* (2013.01); *H01M 10/482* (2013.01);
(Continued)

(58) Field of Classification Search
None
See application file for complete search history.

(56) References Cited

U.S. PATENT DOCUMENTS

| 4,409,304 A | 10/1983 | Gerard et al. |
| 5,503,948 A | 4/1996 | Mackay et al. |

(Continued)

FOREIGN PATENT DOCUMENTS

| EP | 1089373 A | 4/2001 |
| EP | 1505670 A2 | 2/2005 |

(Continued)

OTHER PUBLICATIONS

U.S. Appl. No. 14/617,230, filed Feb. 9, 2015 entitled Battery Module and Method of Coupling First and Second Electrical Terminals of First and Second Battery Cells to a Voltage Sense Member of an Interconnect Assembly.

(Continued)

*Primary Examiner* — Tracy Dove
(74) *Attorney, Agent, or Firm* — Buckert Patent & Trademark Law Firm PC; John F. Buckert

(57) ABSTRACT

A battery cell interconnect and voltage sensing assembly having a plastic frame member having a plate portion and a central wall is provided. The central wall defines an interior region. The assembly further includes a first interconnect member that is coupled to the plate portion that is electrically coupled to a first electrical terminal of a first battery cell. The first interconnect member has a spade lug. The assembly further includes a removable wire harness assembly having an adaptor body, a spade clip, and an electrical cable. The spade clip is disposed in an aperture of the adapter member. The spade clip is electrically and physically coupled to the spade lug of the first interconnect member when the adapter member is at least partially disposed in the interior region.

10 Claims, 14 Drawing Sheets

(51) Int. Cl.
*H01M 2/10* (2006.01)
*H01M 10/6563* (2014.01)
*H01M 10/6557* (2014.01)
*H01M 10/613* (2014.01)
*G01R 31/36* (2006.01)

(52) U.S. Cl.
CPC ..... *H01M 10/613* (2015.04); *H01M 10/6557* (2015.04); *H01M 10/6563* (2015.04); *G01R 31/362* (2013.01)

(56) References Cited

U.S. PATENT DOCUMENTS

| | | | |
|---|---|---|---|
| 5,639,571 | A | 6/1997 | Waters et al. |
| 5,856,041 | A | 1/1999 | Inoue et al. |
| 6,023,146 | A | 2/2000 | Casale et al. |
| 6,261,719 | B1 | 7/2001 | Ikeda et al. |
| 6,521,363 | B1 | 2/2003 | Yeh |
| 6,555,264 | B1 | 4/2003 | Hamada et al. |
| 6,773,301 | B1 | 8/2004 | Chaskin |
| 7,229,327 | B2 | 6/2007 | Zhao et al. |
| 7,270,576 | B2 | 9/2007 | Kim et al. |
| 7,270,912 | B2 | 9/2007 | Oogami |
| 7,294,020 | B2 | 11/2007 | Zhao et al. |
| 7,507,124 | B2 | 3/2009 | Kim |
| 7,563,137 | B1 | 7/2009 | Koetting et al. |
| 7,578,702 | B1 | 8/2009 | Tom et al. |
| 7,642,746 | B2 | 1/2010 | Kim et al. |
| 7,762,848 | B2 | 7/2010 | Koetting et al. |
| 8,035,986 | B2 | 10/2011 | Koetting et al. |
| 9,437,859 | B2 * | 9/2016 | Merriman ......... H01M 10/4207 |
| 2001/0049055 | A1 | 12/2001 | Saito |
| 2003/0027039 | A1 | 2/2003 | Benson et al. |
| 2003/0190522 | A1 | 10/2003 | Ogata |
| 2003/0213121 | A1 | 11/2003 | Rouillard et al. |
| 2004/0043663 | A1 | 3/2004 | Ikeda et al. |
| 2005/0031945 | A1 | 2/2005 | Morita et al. |
| 2005/0031946 | A1 | 2/2005 | Kruger et al. |
| 2005/0130033 | A1 | 6/2005 | Iwamura et al. |
| 2006/0127754 | A1 | 6/2006 | Hamada et al. |
| 2006/0177733 | A1 | 8/2006 | Ha et al. |
| 2006/0194101 | A1 | 8/2006 | Ha et al. |
| 2006/0234558 | A1 | 10/2006 | Li |
| 2006/0246781 | A1 | 11/2006 | Yoon et al. |
| 2007/0134551 | A1 | 6/2007 | Cyr et al. |
| 2007/0238018 | A1 | 10/2007 | Lee et al. |
| 2008/0124617 | A1 | 5/2008 | Bjork |
| 2008/0169788 | A1 | 7/2008 | Bobbin et al. |
| 2008/0254356 | A1 | 10/2008 | Liersch et al. |
| 2009/0139781 | A1 | 6/2009 | Straubel |
| 2009/0325042 | A1 | 12/2009 | Koetting et al. |
| 2010/0062329 | A1 | 3/2010 | Muis |
| 2010/0105258 | A1 | 4/2010 | Koetting et al. |
| 2010/0151312 | A1 | 6/2010 | Kim et al. |
| 2010/0190055 | A1 | 7/2010 | Khakhalev |
| 2010/0247998 | A1 | 9/2010 | Hostler et al. |
| 2011/0293994 | A1 | 12/2011 | Casoli |
| 2012/0088140 | A1 | 4/2012 | Kardasz et al. |
| 2013/0029204 | A1 | 1/2013 | Khakhalev et al. |
| 2013/0052503 | A1 | 2/2013 | Payne |
| 2013/0052511 | A1 | 2/2013 | Khakhalev |
| 2013/0216878 | A1 | 8/2013 | Merriman et al. |
| 2014/0050944 | A1 | 2/2014 | Bertucci et al. |

FOREIGN PATENT DOCUMENTS

| | | |
|---|---|---|
| GB | 2084390 A | 4/1982 |
| JP | 2000123802 A | 4/2000 |
| JP | 2000164200 A | 6/2000 |
| JP | 2000315492 | 11/2000 |
| JP | 2002252036 A | 9/2002 |
| JP | 2003282044 A | 10/2003 |
| JP | 2004055492 A | 2/2004 |
| JP | 2004178860 A | 6/2004 |
| JP | 2006156171 | 6/2006 |
| JP | 2007265945 A | 10/2007 |
| JP | 2014503934 A | 2/2014 |
| KR | 20020051742 A | 6/2002 |
| KR | 20020064366 A | 8/2002 |
| KR | 20060110408 A | 10/2006 |
| KR | 20070057662 A | 6/2007 |
| KR | 20070100555 A | 10/2007 |
| KR | 20080027504 A | 3/2008 |
| KR | 20080027505 A | 3/2008 |
| KR | 20080036258 A | 4/2008 |
| KR | 20090095949 A | 9/2009 |
| KR | 100996957 B | 1/2010 |
| KR | 101042611 B | 1/2010 |
| KR | 20100003146 A | 1/2010 |
| KR | 101050318 B | 10/2010 |
| KR | 20120124764 | 11/2012 |
| KR | 20130094733 | 8/2013 |
| KR | 20140093997 | 7/2014 |
| WO | 0030190 A | 5/2000 |
| WO | 03071616 A2 | 8/2003 |
| WO | 2011027817 A1 | 3/2011 |

OTHER PUBLICATIONS

U.S. Appl. No. 14/617,344, filed Feb. 9, 2015 entitled Battery Module and Method of Coupling First and Second Electrical Terminals of First and Second Battery Cells to First and Second Voltage Sense Members of an Interconnect Assembly.
International Search Report for International application No. PCT/KR2012/006812 dated Feb. 27, 2013.
International Search Report for International application No. PCT/KR2012/006813 dated Feb. 14, 2013.
International Search Report for International application No. PCT/KR2013/001174 dated May 13, 2013.
International Search Report for International Patent Application No. PCT/KR2009/003438 dated Jan. 22, 2010.
International Search Report for International Patent Application No. PCT/KR2009/003440 dated Jan. 22, 2010.
U.S. Appl. No. 14/246,178, filed Apr. 7, 2014 entitled Battery Cell Interconnect and Voltage Sensing Assembly and a Battery Module.

* cited by examiner

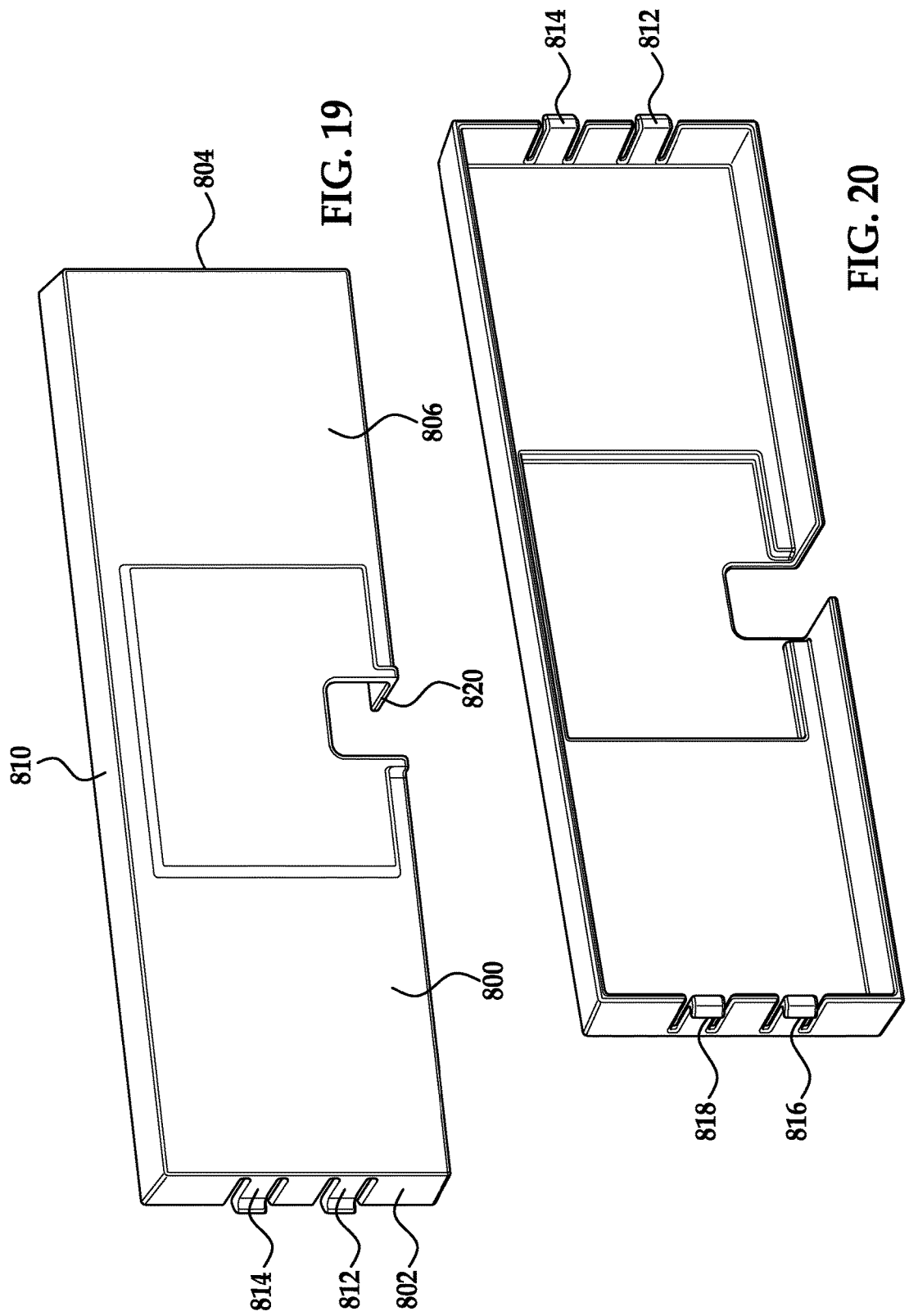

BATTERY CELL INTERCONNECT AND VOLTAGE SENSING ASSEMBLY AND A BATTERY MODULE

BACKGROUND

The inventors herein have recognized a need for an improved battery cell interconnect and voltage sensing assembly and a battery module which utilizes the assembly.

SUMMARY

A battery cell interconnect and voltage sensing assembly in accordance with an exemplary embodiment is provided. The battery cell interconnect and voltage sensing assembly includes a plastic frame member having a plate portion and a central wall. The plate portion has first and second sides. The plate portion further includes first and second elongated apertures extending therethrough. The central wall is coupled to and extends outwardly from the first side of the plate portion. The central wall is disposed between the first and second elongated apertures and defines an interior region. The battery cell interconnect and voltage sensing assembly further includes a first interconnect member that is coupled to the plate portion on the first side thereof. The first interconnect member is configured to be electrically and physically coupled to a first electrical terminal of a first battery cell extending through the first elongated aperture. The first interconnect member has a spade lug. The spade lug of the first interconnect member is disposed in the interior region. The battery cell interconnect and voltage sensing assembly further includes a second interconnect member that is coupled to the plate portion on the first side thereof. The second interconnect member is configured to be electrically and physically coupled to a first electrical terminal of a second battery cell extending through the second elongated aperture. The second interconnect member has a spade lug. The spade lug of the second interconnect member is disposed in the interior region. The battery cell interconnect and voltage sensing assembly further includes a removable wire harness assembly having an adaptor body, first and second spade clips, and first and second electrical cables. The adapter member has first and second sides and further includes first and second apertures extending therethrough. The first spade clip is disposed in the first aperture of the adapter member. The second spade clip is disposed in the second aperture of the adapter member. The first spade clip is electrically and physically coupled to the spade lug of the first interconnect member when the adapter member is at least partially disposed in the interior region. The first spade clip is further electrically and physically coupled to the first electrical cable. The second spade clip is electrically and physically coupled to the spade lug of the second interconnect member when the adapter member is at least partially disposed in the interior region. The second spade clip is further electrically and physically coupled to the second electrical cable.

A battery module in accordance with another exemplary embodiment is provided. The battery module includes a first battery cell having a first housing and first and second electrical terminals extending outwardly from first and second ends, respectively, of the first housing. The battery module further includes a second battery cell having a second housing and first and second electrical terminals extending outwardly from first and second ends, respectively, of the second housing. The battery module further includes first and second frame members that are configured to hold the first and second battery cells therebetween. The battery module further includes a battery cell interconnect and voltage sensing assembly that is coupled to the first and second frame members. The battery cell interconnect and voltage sensing assembly has a plastic frame member, first and second interconnect members, and a removable wire harness assembly. The plastic frame member has a plate portion and a central wall. The plate portion includes first and second sides. The plate portion further includes first and second elongated apertures extending therethrough. The central wall is coupled to and extends outwardly from the first side of the plate portion. The central wall is disposed between the first and second elongated apertures and defines an interior region. The first interconnect member is coupled to the plate portion on the first side thereof. The first interconnect member is configured to be electrically and physically coupled to the first electrical terminal of the first battery cell extends through the first elongated aperture. The first interconnect member has a spade lug. The spade lug of the first interconnect member is disposed in the interior region. The second interconnect member is coupled to the plate portion on the first side thereof. The second interconnect member is configured to be electrically and physically coupled to the first electrical terminal of the second battery cell extending through the second elongated aperture. The second interconnect member has a spade lug. The spade lug of the second interconnect member is disposed in the interior region. The removable wire harness assembly has an adaptor body, first and second spade clips, and first and second electrical cables. The adapter member has first and second sides and further includes first and second apertures extending therethrough. The first spade clip is disposed in the first aperture of the adapter member. The second spade clip is disposed in the second aperture of the adapter member. The first spade clip is electrically and physically coupled to the spade lug of the first interconnect member when the adapter member is at least partially disposed in the interior region. The first spade clip is further electrically and physically coupled to the first electrical cable. The second spade clip is electrically and physically coupled to the spade lug of the second interconnect member when the adapter member is at least partially disposed in the interior region. The second spade clip is further electrically and physically coupled to the second electrical cable.

BRIEF DESCRIPTION OF THE DRAWINGS

FIG. 19 is a schematic of a plastic cover plate utilized in the first battery cell interconnect and voltage sensing assembly of FIG. 16; and FIG. 20 is another schematic of the plastic cover plate of FIG. 19.

DETAILED DESCRIPTION

Figure 1:
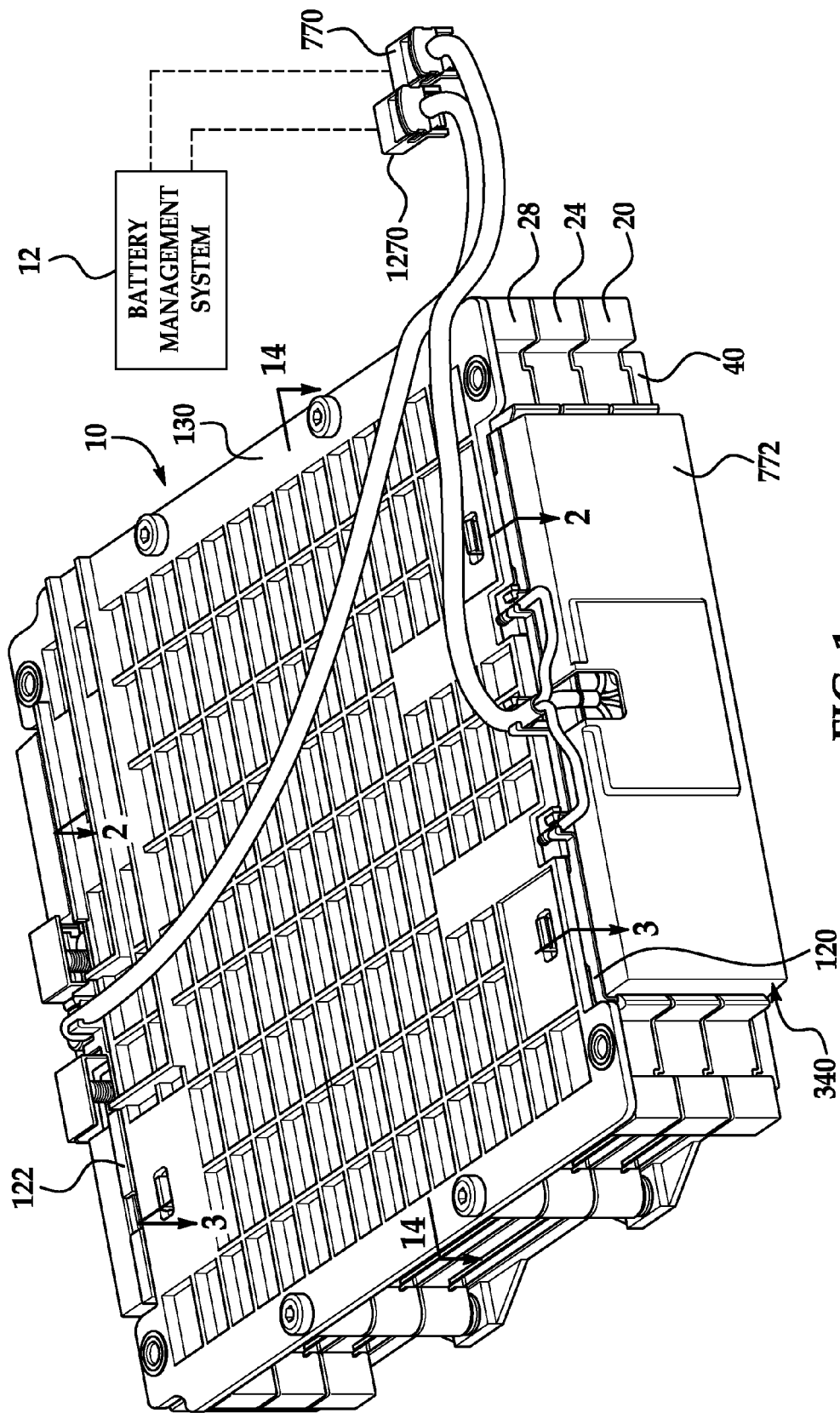
FIG. 1 is a schematic of a battery module having first and second battery cell interconnect and voltage sensing assemblies in accordance with an exemplary embodiment.

Referring to FIGS. 1-9 and 14, a battery module 10 in accordance with an exemplary embodiment is provided. The battery module 10 is electrically coupled to a battery management system 12. The battery module 10 includes frame members 20, 24, 28, insulating layers 40, 44, battery cells 50, 54, 58, 62, 66, 70, 80, 84, 88, 92, 96, 100, heat exchangers 110, 112, 114, battery cell interconnect and voltage sensing assemblies 120, 122, and an end plate 130. An advantage of the battery module 10 is that the module 10 utilizes a removable wire harness assembly 340 having an adapter member that holds spade clips therein for easily coupling the wire harness assembly to the battery module 10.

Figure 2:
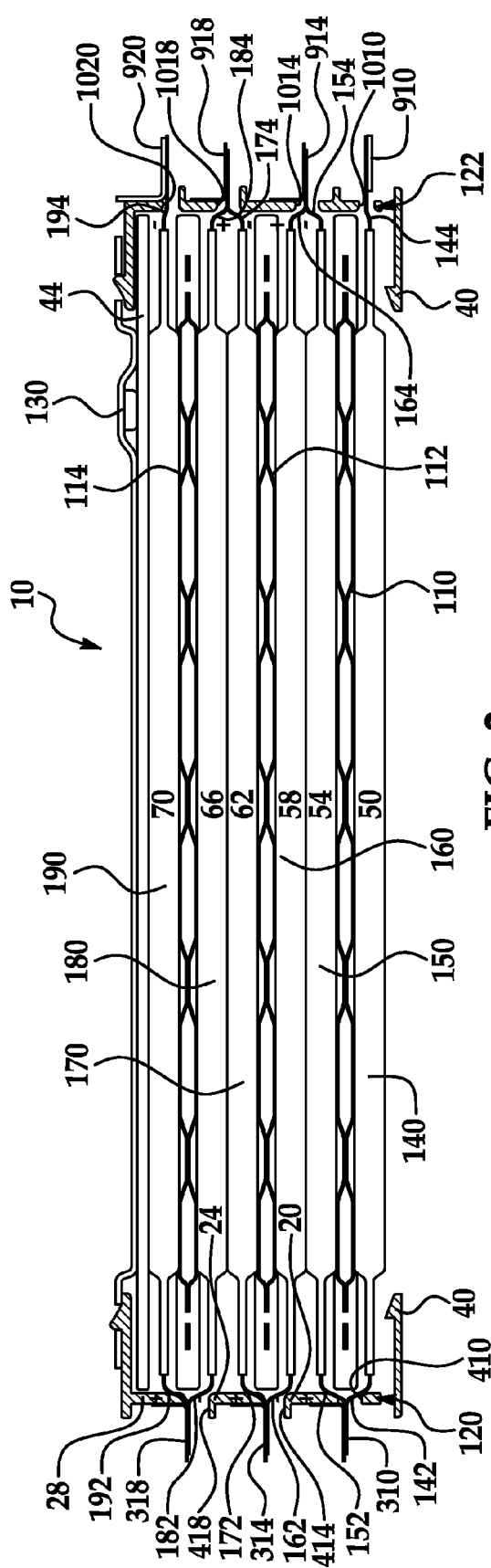
FIG. 2 is a cross-sectional schematic of a portion of the battery module of FIG. 1 taken along lines 2-2 of FIG. 1.
Figure 3:
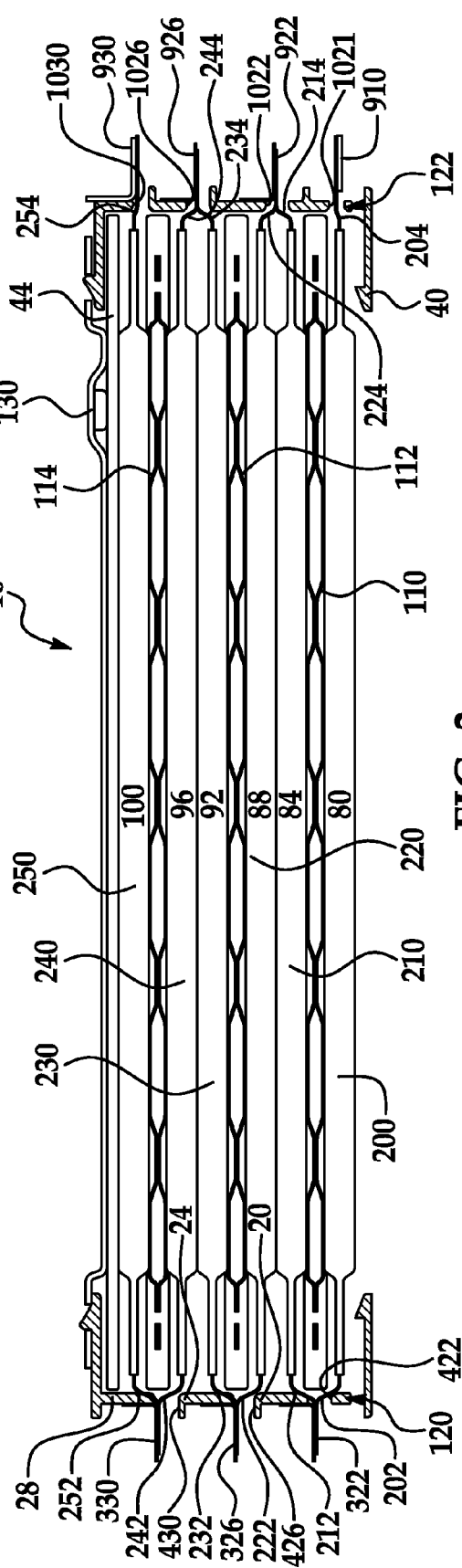
FIG. 3 is another cross-sectional schematic of a portion of the battery module of FIG. 1 taken along lines 3-3 of FIG. 1.
Figure 15:
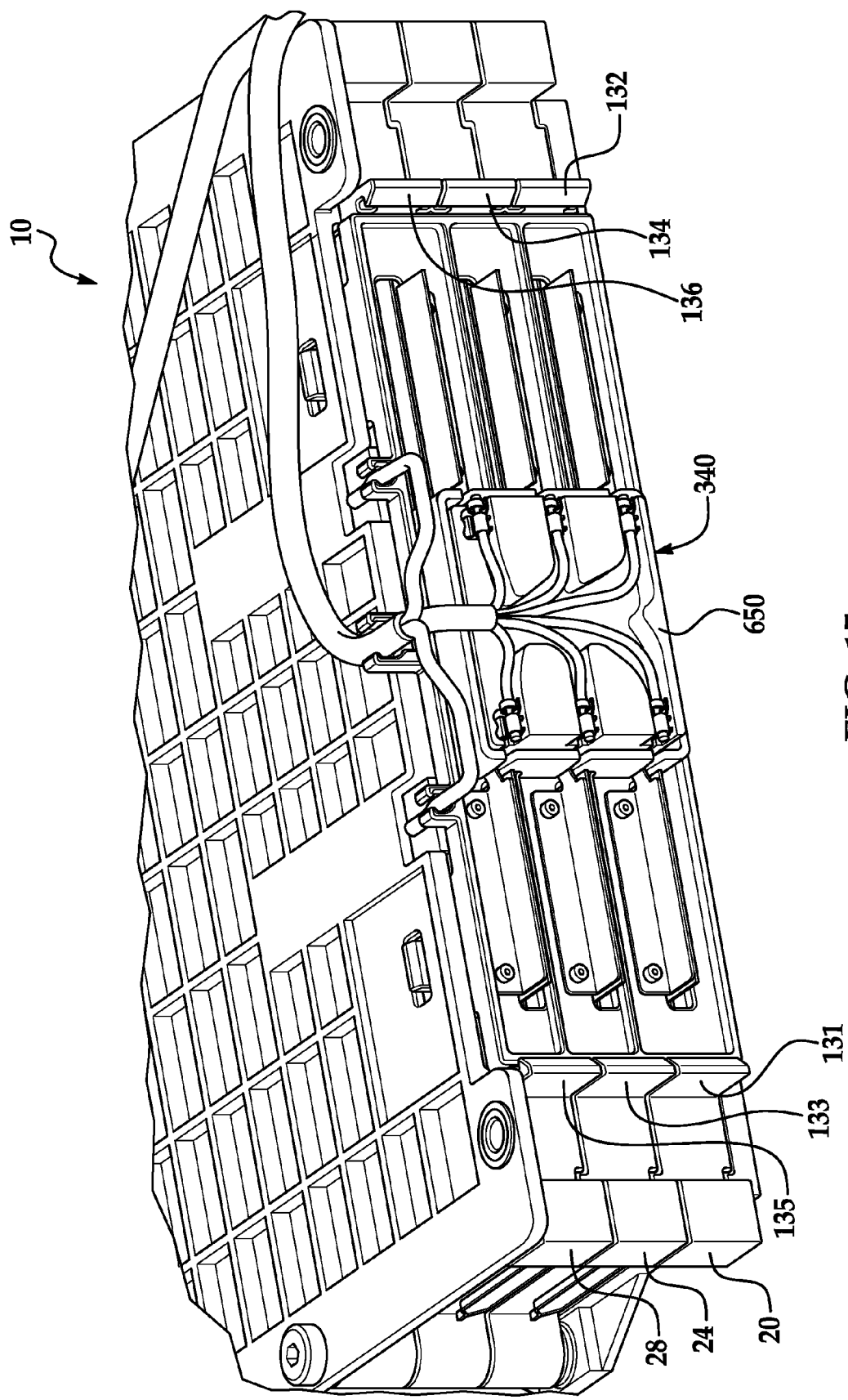
FIG. 15 is a schematic of a portion of the battery module of FIG. 1 having a plastic cover plate removed therefrom.
Figure 16:
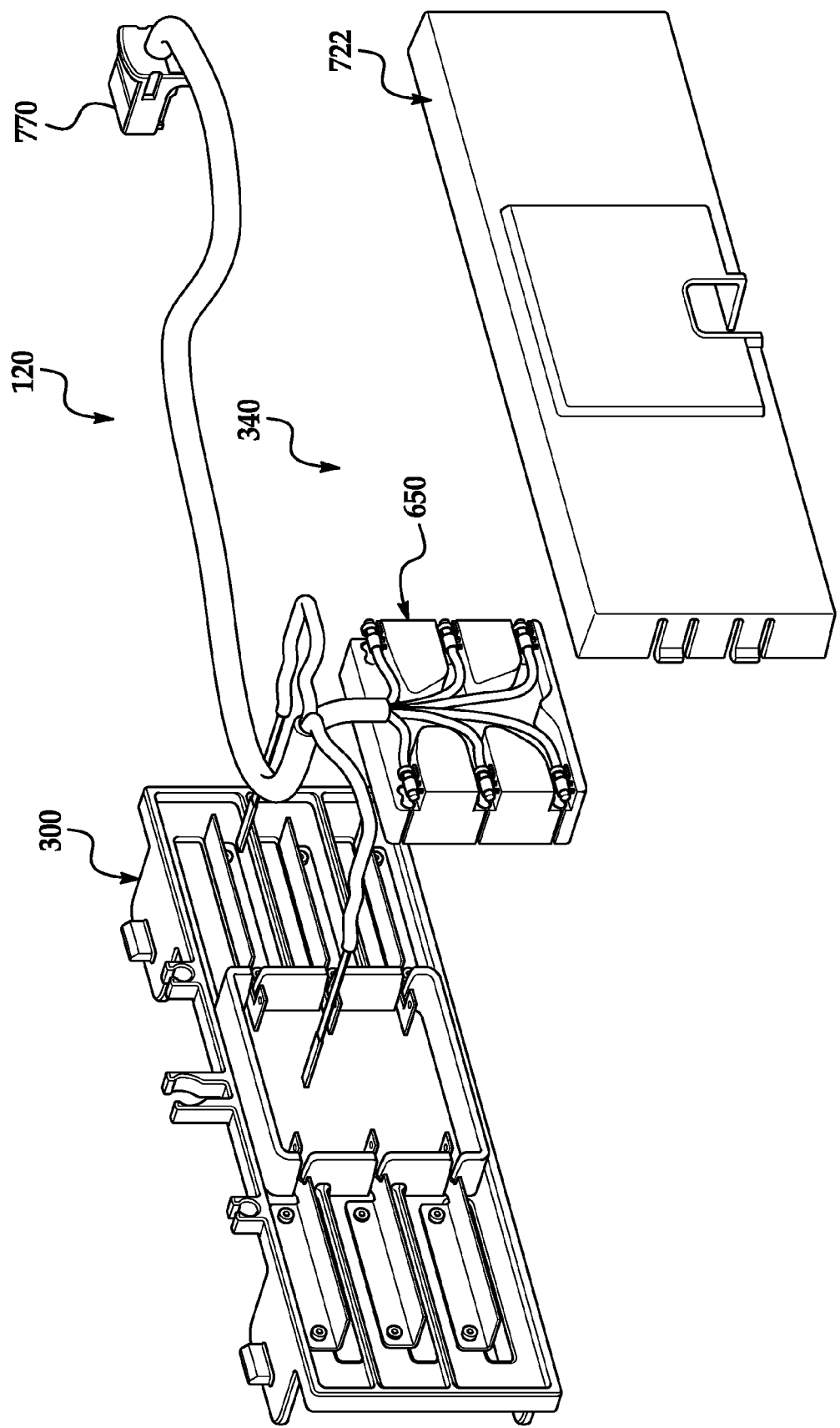
FIG. 16 is exploded view of the first battery cell interconnect and voltage sensing assembly having a removable wire harness assembly.

Referring to FIGS. 1-3, the frame member 20 and the insulating layer 40 are configured to hold the battery cell 50, the heat exchanger 110, and the battery cell 54, therebetween. The heat exchanger 110 is disposed between the battery cells 50, 54. The frame member 20 and the insulating layer 40 (shown in FIG. 3) are further configured to hold the battery cell 80, the heat exchanger 110, and the battery cell 84 therebetween. The heat exchanger 110 is further disposed between the battery cells 80, 84. Referring to FIGS. 15, 19 and 20, the frame member 20 includes coupling tabs 131, 132 that are configured to receive corresponding coupling tabs from the plastic cover plate 772 thereon for removably holding the plastic cover plate 772 on the frame member 20. The frame member 20 further includes two additional coupling tabs (not shown) that are configured to receive corresponding coupling tabs from a plastic cover plate of the battery cell interconnect and voltage sensing assembly 122 for removably holding the other plastic cover plate on the frame member 20.

Referring to FIGS. 1-3, the frame member 20 and the frame member 24 are configured to hold the battery cell 58, the heat exchanger 112, and the battery cell 62, therebetween. The heat exchanger 112 is disposed between the battery cells 58, 62. The frame member 20 and the frame member 24 are further configured to hold the battery cell 88, the heat exchanger 112, and the battery cell 92 therebetween. The heat exchanger 112 is further disposed between the battery cells 88, 92. Referring to FIGS. 15, 19 and 20, the frame member 24 includes coupling tabs 133, 134 that are configured to receive corresponding coupling tabs from the plastic cover plate 772 thereon for removably holding the plastic cover plate 772 on the frame member 24. The frame member 24 further includes two additional coupling tabs (not shown) that are configured to receive corresponding coupling tabs from a plastic cover plate of the battery cell interconnect and voltage sensing assembly 122 for removably holding the other plastic cover plate on the frame member 24.

Referring to FIGS. 1-3, the frame member 24 and the frame member 28 are configured to hold the battery cell 66, the heat exchanger 114, and the battery cell 70, therebetween. The heat exchanger 114 is disposed between the battery cells 66, 70. The frame member 24 and the frame member 28 are further configured to hold the battery cell 96, the heat exchanger 114, and the battery cell 100 therebetween. The heat exchanger 114 is further disposed between the battery cells 96, 100. Referring to FIGS. 15, 19 and 20, the frame member 28 includes coupling tabs 135, 136 that are configured to receive corresponding coupling tabs from the plastic cover plate 772 thereon for removably holding the plastic cover plate 772 on the frame member 28. The frame member 28 further includes two additional coupling tabs (not shown) that are configured to receive corresponding coupling tabs from a plastic cover plate of the battery cell interconnect and voltage sensing assembly 122 for removably holding the other plastic cover plate on the frame member 28.

Referring to FIGS. 2 and 3, the battery cells 50, 54, 58, 62, 66, 70, 80, 84, 88, 92, 96, 100 are each configured to generate an operational voltage. In one exemplary embodiment, the battery cells 50-100 are pouch-type lithium-ion battery cells that have a generally rectangular-shaped body portion and a pair of electrical terminals. In an exemplary embodiment, the battery cells 50-100 are electrically coupled in series with one another utilizing interconnect members on the battery cell interconnect and voltage sensing assemblies 120, 122. Further, in an exemplary embodiment, the electrical terminals of the battery cells 50-100 are coupled to corresponding interconnect members by ultrasonically welding the electrical terminals of the battery cells 50-100 to the corresponding interconnect members utilizing an ultrasonic welding machine.

The battery cell 50 has a rectangular-shaped housing 140 with electrical terminals 142, 144, extending from first and second ends, respectively, of the housing 140. The electrical terminal 142 extends through the elongated aperture 410 and is electrically and physically coupled to the interconnect member 310 of the battery cell interconnect and voltage sensing assembly 120. The electrical terminal 144 extends through the elongated aperture 1010 and is electrically and physically coupled to the interconnect member 910 of the battery cell interconnect and voltage sensing assembly 122.

The battery cell 50 is disposed between the insulating layer 40 and the heat exchanger 110.

The battery cell 54 has a rectangular-shaped housing 150 with electrical terminals 152, 154, extending from first and second ends, respectively, of the housing 150. The electrical terminal 152 extends through the elongated aperture 410 and is electrically and physically coupled to the interconnect member 310 of the battery cell interconnect and voltage sensing assembly 120. The electrical terminal 154 extends through the elongated aperture 1014 and is electrically and physically coupled to the interconnect member 914 of the battery cell interconnect and voltage sensing assembly 122. The battery cell 54 is disposed between the heat exchanger 110 and the battery cell 58.

The battery cell 58 has a rectangular-shaped housing 160 with electrical terminals 162, 164, extending from first and second ends, respectively, of the housing 160. The electrical terminal 162 extends through the elongated aperture 414 and is electrically and physically coupled to the interconnect member 314 of the battery cell interconnect and voltage sensing assembly 120. The electrical terminal 164 extends through the elongated aperture 1014 and is electrically and physically coupled to the interconnect member 914 of the battery cell interconnect and voltage sensing assembly 122. The battery cell 58 is disposed between the battery cell 54 and the heat exchanger 112.

The battery cell 62 has a rectangular-shaped housing 170 with electrical terminals 172, 174, extending from first and second ends, respectively, of the housing 170. The electrical terminal 172 extends through the elongated aperture 414 and is electrically and physically coupled to the interconnect member 314 of the battery cell interconnect and voltage sensing assembly 120. The electrical terminal 174 extends through the elongated aperture 1018 and is electrically and physically coupled to the interconnect member 918 of the battery cell interconnect and voltage sensing assembly 122. The battery cell 62 is disposed between the heat exchanger 112 and the battery cell 66.

The battery cell 66 has a rectangular-shaped housing 180 with electrical terminals 182, 184, extending from first and second ends, respectively, of the housing 180. The electrical terminal 182 extends through the elongated aperture 418 and is electrically and physically coupled to the interconnect member 318 of the battery cell interconnect and voltage sensing assembly 120. The electrical terminal 184 extends through the elongated aperture 1018 and is electrically and physically coupled to the interconnect member 918 of the battery cell interconnect and voltage sensing assembly 122. The battery cell 66 is disposed between the battery cell 62 and the heat exchanger 114.

The battery cell 70 has a rectangular-shaped housing 190 with electrical terminals 192, 194, extending from first and second ends, respectively, of the housing 190. The electrical terminal 192 extends through the elongated aperture 418 and is electrically and physically coupled to the interconnect member 318 of the battery cell interconnect and voltage sensing assembly 120. The electrical terminal 194 extends through the elongated aperture 1020 and is electrically and physically coupled to the interconnect member 920 of the battery cell interconnect and voltage sensing assembly 122. The interconnect member 920 is further electrically and physically coupled to the post 932 (shown in FIG. 10). The battery cell 70 is disposed between the heat exchanger 114 and the insulating layer 44.

Referring to FIGS. 1-3, the series combination of the battery cells 50-70 are electrically coupled in series with the series combination of the battery cells 80-100 utilizing the elongated interconnect member 910.

Referring to FIG. 3, the battery cell 80 has a rectangular-shaped housing 200 with electrical terminals 202, 204, extending from first and second ends, respectively, of the housing 200. The electrical terminal 202 extends through the elongated aperture 422 and is electrically and physically coupled to the interconnect member 322 of the battery cell interconnect and voltage sensing assembly 120. The electrical terminal 204 extends through the elongated aperture 1021 and is electrically and physically coupled to the interconnect member 910 of the battery cell interconnect and voltage sensing assembly 122. The battery cell 80 is disposed between the insulating layer 40 and the heat exchanger 110.

The battery cell 84 has a rectangular-shaped housing 210 with electrical terminals 212, 214, extending from first and second ends, respectively, of the housing 210. The electrical terminal 212 extends through the elongated aperture 422 and is electrically and physically coupled to the interconnect member 322 of the battery cell interconnect and voltage sensing assembly 120. The electrical terminal 214 extends through the elongated aperture 1022 and is electrically and physically coupled to the interconnect member 922 of the battery cell interconnect and voltage sensing assembly 122. The battery cell 84 is disposed between the heat exchanger 110 and the battery cell 88.

The battery cell 88 has a rectangular-shaped housing 220 with electrical terminals 222, 224, extending from first and second ends, respectively, of the housing 220. The electrical terminal 222 extends through the elongated aperture 426 and is electrically and physically coupled to the interconnect member 326 of the battery cell interconnect and voltage sensing assembly 120. The electrical terminal 224 extends through the elongated aperture 1022 and is electrically and physically coupled to the interconnect member 922 of the battery cell interconnect and voltage sensing assembly 122. The battery cell 88 is disposed between the battery cell 84 and the heat exchanger 112.

The battery cell 92 has a rectangular-shaped housing 230 with electrical terminals 232, 234, extending from first and second ends, respectively, of the housing 230. The electrical terminal 232 extends through the elongated aperture 426 and is electrically and physically coupled to the interconnect member 326 of the battery cell interconnect and voltage sensing assembly 120. The electrical terminal 234 extends through the elongated aperture 1026 and is electrically and physically coupled to the interconnect member 926 of the battery cell interconnect and voltage sensing assembly 122. The battery cell 92 is disposed between the heat exchanger 112 and the battery cell 96.

The battery cell 96 has a rectangular-shaped housing 240 with electrical terminals 242, 244, extending from first and second ends, respectively, of the housing 240. The electrical terminal 242 extends through the elongated aperture 430 and is electrically and physically coupled to the interconnect member 330 of the battery cell interconnect and voltage sensing assembly 120. The electrical terminal 244 extends through the elongated aperture 1026 and is electrically and physically coupled to the interconnect member 926 of the battery cell interconnect and voltage sensing assembly 122. The battery cell 96 is disposed between the battery cell 92 and the heat exchanger 114.

The battery cell 100 has a rectangular-shaped housing 250 with electrical terminals 252, 254, extending from first and second ends, respectively, of the housing 250. The electrical terminal 252 extends through the elongated aperture 430 and is electrically and physically coupled to the interconnect member 330 of the battery cell interconnect and voltage sensing assembly 120. The electrical terminal 254 extends through the elongated aperture 1030 and is electrically and physically coupled to the interconnect member 930 of the battery cell interconnect and voltage sensing assembly 122. The interconnect member 930 is further electrically and physically coupled to the post 934 (shown in FIG. 10). The battery cell 100 is disposed between the heat exchanger 114 and the insulating layer 44. The end plate 130 is disposed on the insulating layer 44.

Referring to FIGS. 2 and 3, the heat exchanger 110 is disposed between and contacts the battery cells 50, 54. Further, the heat exchanger 110 is disposed between and contacts the battery cells 80, 84. In an exemplary embodiment, heat exchanger 110 is constructed of aluminum and defines a plurality of passages extending therethrough. A cooling system urges air through the plurality of passages in the heat exchanger 110 which extracts heat energy from the battery cells 50, 54, 80, 84 to cool the battery cells 50, 54, 80, 84.

The heat exchanger 112 is disposed between and contacts the battery cells 58, 62. Further, the heat exchanger 112 is disposed between and contacts the battery cells 88, 92. In an exemplary embodiment, heat exchanger 112 is constructed of aluminum and defines a plurality of passages extending therethrough. The cooling system urges air through the plurality of passages in the heat exchanger 112 which extracts heat energy from the battery cells 58, 62, 88, 92 to cool the battery cells 58, 62, 88, 92.

The heat exchanger 114 is disposed between and contacts the battery cells 66, 70. Further, the heat exchanger 114 is disposed between and contacts the battery cells 96, 100. In an exemplary embodiment, heat exchanger 114 is constructed of aluminum and defines a plurality of passages extending therethrough. The cooling system urges air through the plurality of passages in the heat exchanger 114 which extracts heat energy from the battery cells 66, 70, 96, 100 to cool the battery cells 66, 70, 96, 100.

Figure 9:
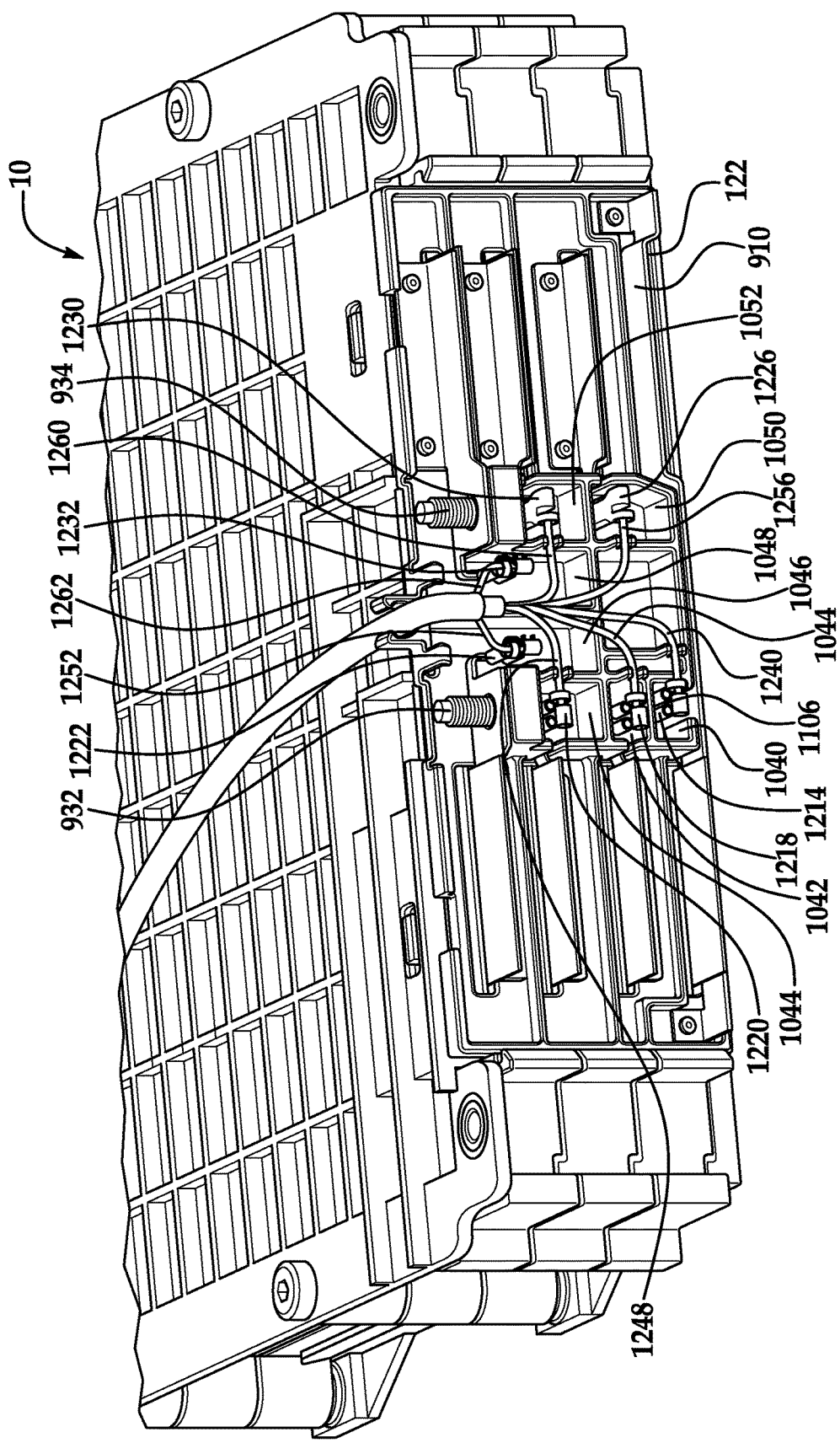
FIG. 9 is an enlarged schematic of a portion of the battery module of FIG. 1 illustrating a portion of the second battery cell interconnect and voltage sensing assembly utilized therein.

Referring to FIGS. 1 and 9, the battery cell interconnect and voltage sensing assemblies 120, 122 are configured to electrically couple the battery cells 50-100 in series with one another.

Referring to FIGS. 2-5, 15 and 16, the battery cell interconnect and voltage sensing assembly 120 will now be described. The assembly 120 includes a plastic frame member 300, interconnect members 310, 314, 318, 322, 326, 330, and a removable wire harness assembly 340.

The plastic frame member 300 is provided to hold the remaining components of the battery cell interconnect and voltage sensing assembly 120 thereon. The plastic frame member 300 includes a plate portion 370, a central wall 374, dividing walls 378, 382, 386, and attachment tabs 390, 392.

The plate portion 370 has a first side 400 and a second side 402 that is disposed opposite to the first side 400. The plate portion 370 further includes elongated apertures 410, 414, 418, 422, 426, 430 extending therethrough. The elongated apertures 410, 414, 418, 422, 426, 430 extend substantially parallel to the longitudinal axis 350 of the plastic frame member 300. Further, the elongated apertures 410, 414, 418 are centered about an axis 352. Also, the elongated apertures 422, 426, 430 are centered about an axis 354. The axes 352, 354 are perpendicular to the longitudinal axis 350 and are disposed a longitudinal distance apart from one another.

Figure 4:
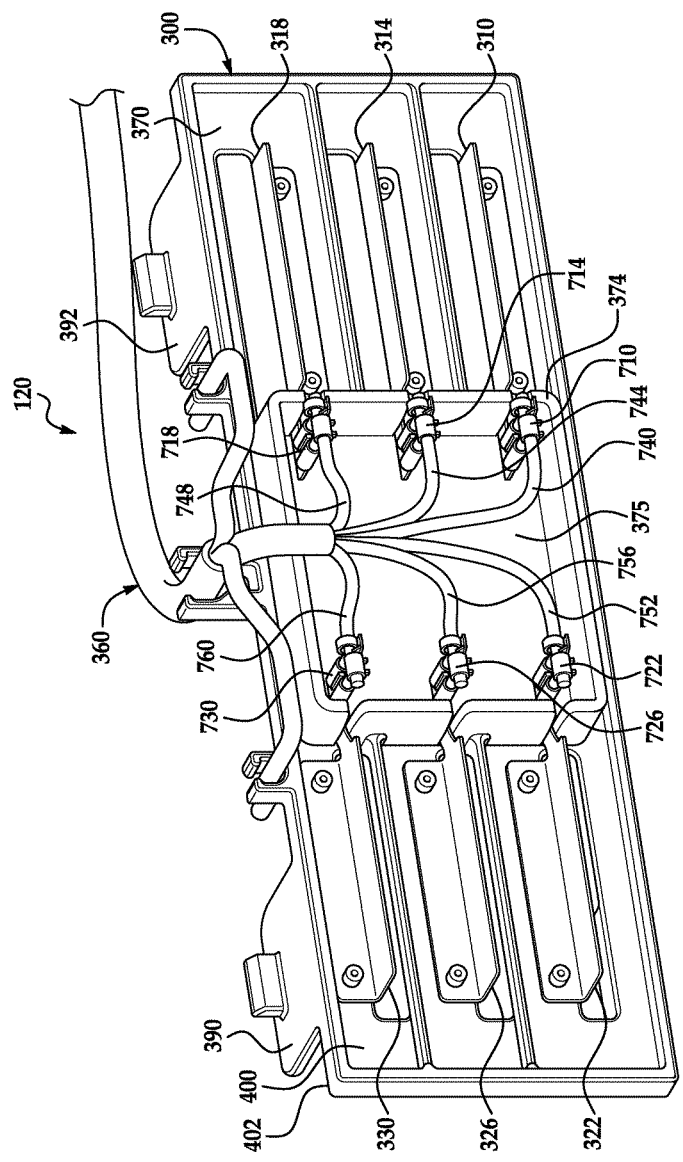
FIG. 4 is a schematic of a portion of the first battery cell interconnect and voltage sensing assembly utilized in the battery module of FIG. 1.
Figure 5:
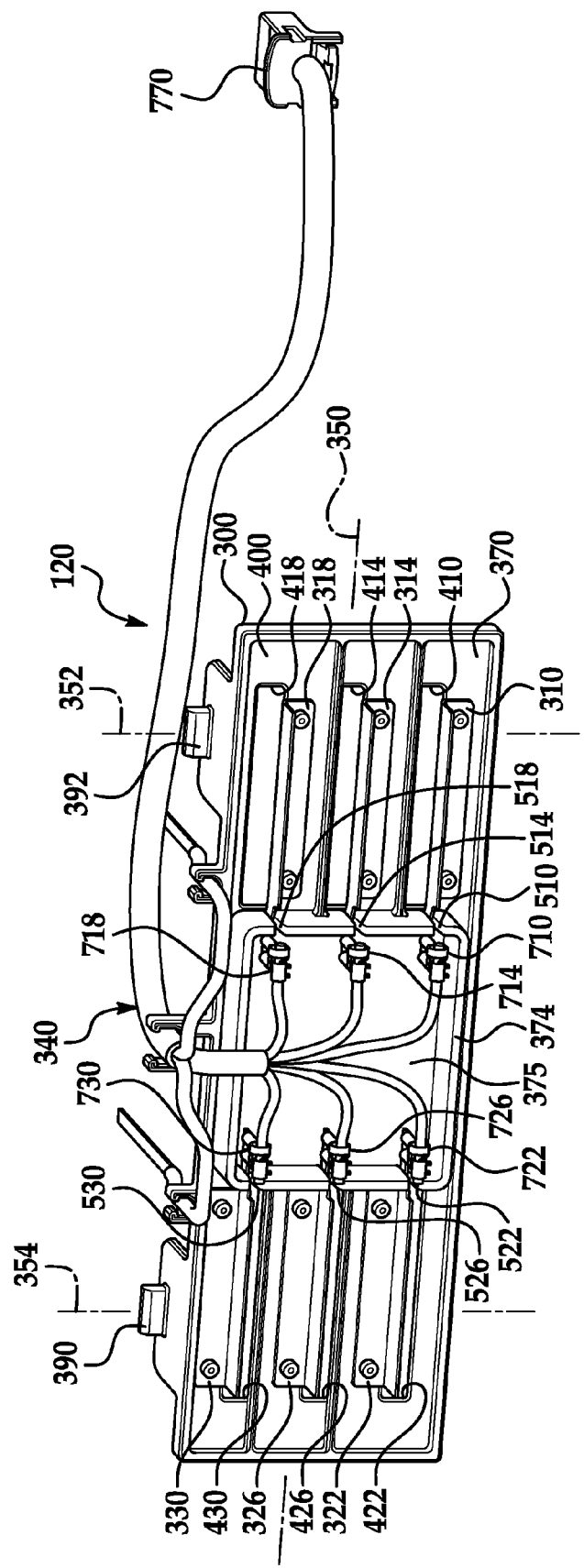
FIG. 5 is another schematic of a portion of the first battery cell interconnect and voltage sensing assembly of FIG. 4.
Figure 6:
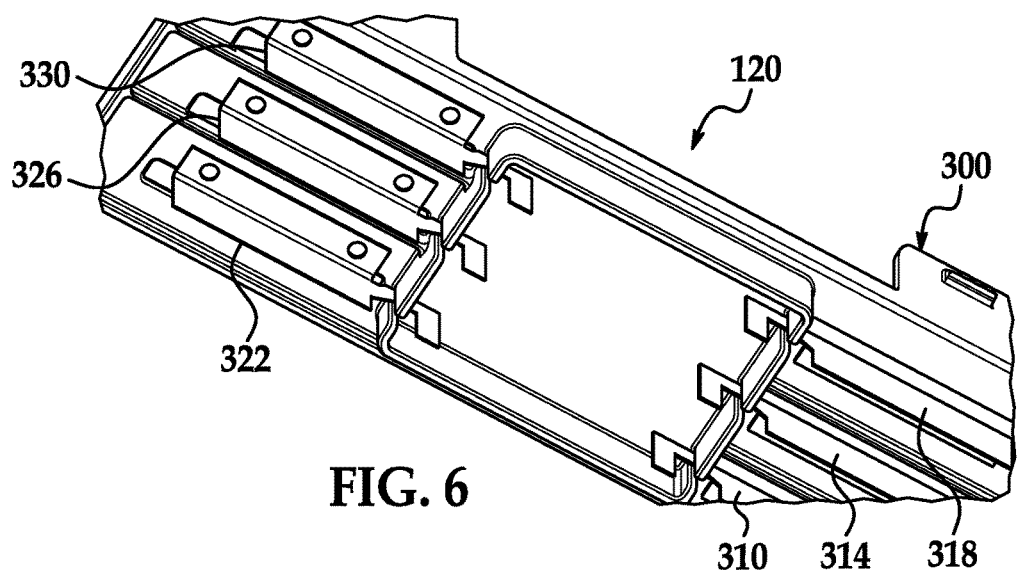
FIG. 6 is an enlarged schematic of a portion of the first battery cell interconnect and voltage sensing assembly of FIG. 4.

Referring to FIGS. 4 and 5, the central wall 374 defines an interior region 375. In an exemplary embodiment, the central wall 374 substantially rectangular ring-shaped. However, in an alternative embodiment, the central wall 374 could have another shapes configured to receive the adapter member 650 (shown in FIG. 20). The interior region 375 has the spade clips 710, 714, 718, 722, 726, 730, respectively, disposed therein.

The central wall 374 further includes grooves 510, 514, 518, 522, 526, 530 extending therethrough for receiving portions of the interconnect members 310, 314, 318, 322, 326, 330, respectively, therethrough.

Referring to FIGS. 1 and 5, the attachment tabs 390, 392 are provided to attach the battery cell interconnect and voltage sensing assembly 120 to the frame member 28. The attachment tabs 390, 392 are coupled to an end of the plate portion 370 substantially perpendicular to the plate 370.

Referring to FIGS. 2, 3, and 5, the interconnect members 310, 314, 318, 322, 326, 330 are coupled to the first side 400 of the plate portion 370. Further, the interconnect members 310, 314, 318, 322, 326, 330 are disposed proximate to the elongated apertures 410, 414, 418, 422, 426, 430, respectively, in the plate portion 370. In an exemplary embodiment, the interconnect members 310-330 are constructed from copper or nickel-plated copper. However, in alternative embodiments, the other electrically conducting materials can be used to construct the interconnect members 310-330. The interconnect members 310-216 have an identical structure to each other. For purposes of simplicity, only the structure of the interconnect member 310 will be discussed in greater detail below.

Figure 8:
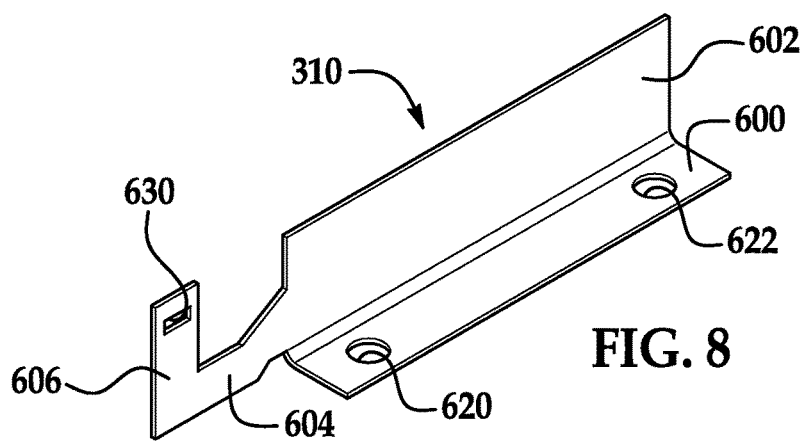
FIG. 8 is a schematic of an electrical connector utilized in the first battery cell interconnect and voltage sensing assembly of FIG. 4.

Referring to FIGS. 5 and 8, the interconnect member 310 includes a first plate portion 600, a second plate portion 602, an extension portion 604, and a spade lug 606. The second plate portion 602 is coupled to an end of the first plate portion 600 and extends substantially perpendicular to the first plate portion 600. The extension portion 604 is coupled to an end of the second plate portion 602 and extends substantially parallel to the second plate portion 602. The spade lug 606 is coupled to the extension portion 604 and extends substantially perpendicular to the first plate portion 600. The spade lug 606 is configured to be removably electrically and physically coupled to the spade clip 710. The spade lug 606 has a spade lug aperture 630 extending therethrough which is substantially rectangular-shaped and is configured to receive a latching member of the spade clip 710 therethrough.

Referring to FIGS. 2, 5 and 8, the first plate portion 600 includes apertures 620, 622 which receive first and second mounting tabs extending from the first side 400 of the plate portion 370 for coupling the first plate portion 600 to the first side 400 of the plate 370. The second plate portion 602 is disposed proximate to the elongated aperture 410 and is electrically and physically coupled to the electrical terminals 142, 152 of the battery cells 50, 54, respectively. Further, the extension portion 604 extends through the groove 510 such that the spade lug 606 is disposed within the interior region 540. The spade clip 710 is removably attached to the spade lug 606 within the interior region 540.

The interconnect member 314 is coupled to the first side 400 of the plate portion 370 proximate to the elongated aperture 414. The interconnect member 314 is electrically and physically coupled to the electrical terminals 162, 172 of the battery cells 58, 62, respectively. The interconnect member 314 is further electrically and physically coupled to the spade clip 714.

The interconnect member 318 is coupled to the first side 400 of the plate portion 370 proximate to the elongated aperture 418. The interconnect member 318 is electrically and physically coupled to the electrical terminals 182, 192 of the battery cells 66, 70 respectively. The interconnect member 318 is further electrically and physically coupled to the spade clip 718.

Referring to FIGS. 3 and 5, the interconnect member 322 is coupled to the first side 400 of the plate portion 370 proximate to the elongated aperture 422. The interconnect member 322 is electrically and physically coupled to the electrical terminals 202, 212 of the battery cells 80, 84 respectively. The interconnect member 322 is further electrically and physically coupled to the spade clip 722.

The interconnect member 326 is coupled to the first side 400 of the plate portion 370 proximate to the elongated aperture 426. The interconnect member 326 is electrically and physically coupled to the electrical terminals 222, 232 of the battery cells 88, 92 respectively. The interconnect member 326 is further electrically and physically coupled to the spade clip 726.

The interconnect member 330 is coupled to the first side 400 of the plate portion 370 proximate to the elongated aperture 430. The interconnect member 330 is electrically and physically coupled to the electrical terminals 242, 252 of the battery cells 96, 100 respectively. The interconnect member 330 is further electrically and physically coupled to the spade clip 730.

Referring to FIGS. 1, 4, 5 and 15-20, the removable wire harness assembly 340 is provided to route voltages from the interconnect members 310, 314, 318, 322, 326, 330 to a battery management system 12. The removable wire harness assembly 340 includes spade clips 710, 714, 718, 722, 726, 730, electrical cables 740, 744, 748, 752, 756, 760, an electrical connector 770, and a plastic cover plate 772.

Figure 17:
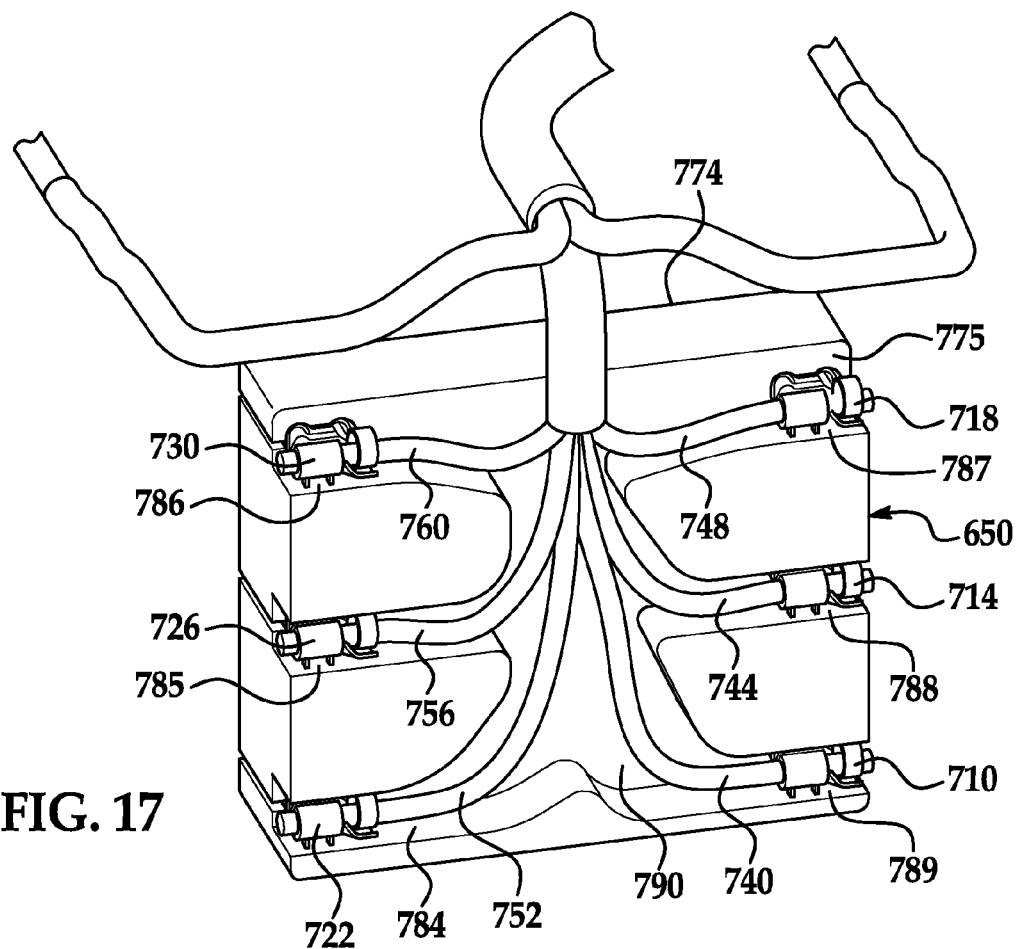
FIG. 17 is a schematic of the removable wire harness assembly of FIG. 16.
Figure 18:
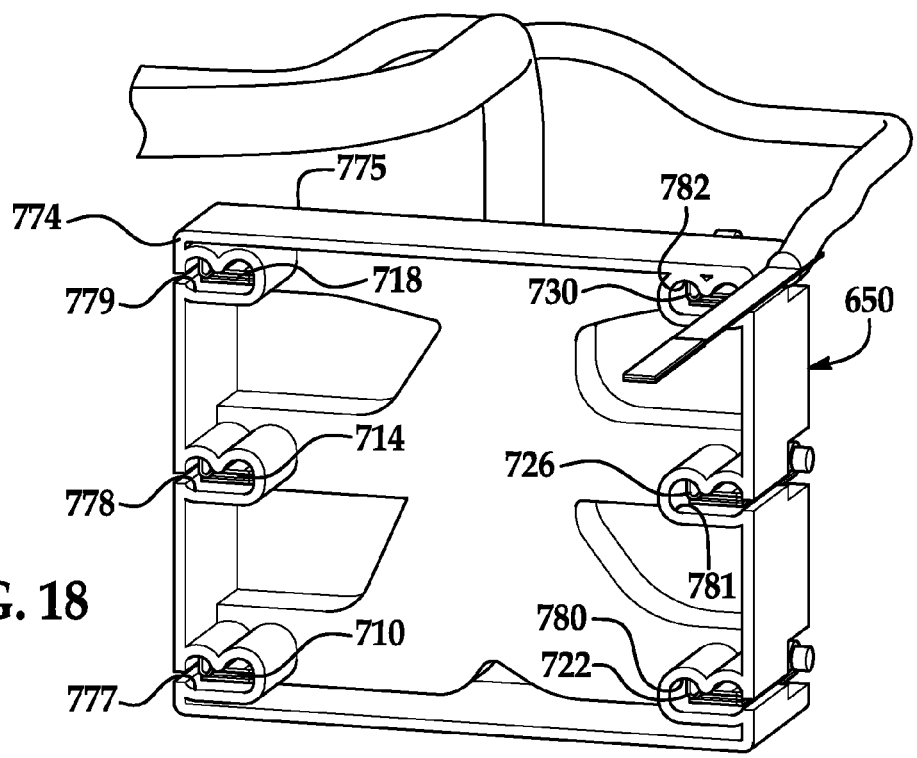
FIG. 18 is another schematic of the removable wire harness assembly of FIG. 16.

Referring to FIGS. 17 and 18, the adapter member 650 is provided to hold the spade clips 710-730 therein and to hold portions of the electrical cables 740-760 therein. The adapter member 650 has a substantially rectangular shaped cross-sectional profile. The adapter member 650 includes a first side 774 and a second side 775 disposed substantially parallel to the first side 774. The adapter member 650 further includes apertures 777, 778, 779, 780, 781, 782 extending therethrough configured to receive the spade clips 710, 714, 718, 722, 726, 730, respectively, therein. The spade clips 710, 714, 718, 722, 726, 730 are accessible through the first side 774 of the adapter member 650 such that respective spade lugs of the interconnect members are removably coupled physically and electrically to the spade clips 710-730, respectively.

The adapter member 650 includes cable apertures 784, 785, 786, 787, 788, 789 extending therein and a central cable aperture 790 extending therein. The central cable aperture 790 communicates with the cable apertures 784-789. The cable apertures 784, 785, 786, 787, 788, 789 are configured to receive portions of the electrical cables 740, 744, 748, 752, 756, 760, respectively, therein for routing the electrical cables 740, 744, 748, 752, 756, 760 from the spade clips 710, 714, 718, 722, 726, 730, respectively, to the central cable aperture 790. The electrical cables 740-760 are routed through the central cable aperture 790 to a region outside of the adapter member 650. The adapter member 650 is sized and shaped to be received within the interior region 375 (shown in FIG. 4) defined by the central wall 374. In an exemplary embodiment, the adapter member 650 is constructed of plastic.

Figure 7:
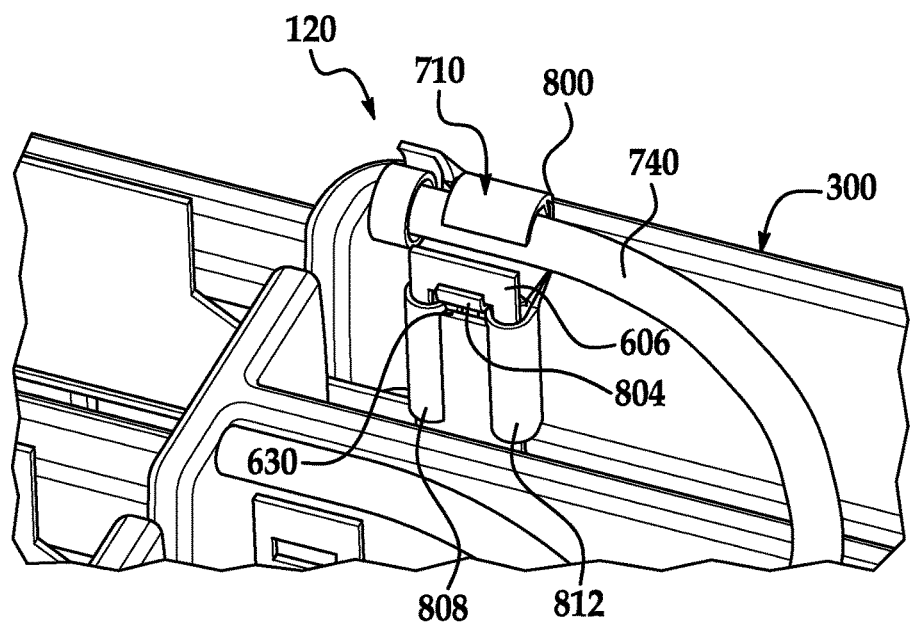
FIG. 7 is an enlarged schematic of a spade clip coupled to an electrical connector in the first battery cell interconnect and voltage sensing assembly of FIG. 4.

Referring to FIGS. 4, 5 and 7, the structure of the spade clips 710-730 are identical to one another. Accordingly, only the structure of the spade clip 710 will be discussed in detail. The spade clip 710 is configured to be removably coupled to the spade lug 606. The spade clip 710 includes a cable coupling portion 800, a latching member 804, and mounting members 808, 812. The latching member 804 is coupled to and extends outwardly from the cable coupling portion 800. Further, the mounting members 808, 812 are substantially arcuate-shaped and are coupled to and extend from the cable coupling portion 800 such that the latching member 804 is disposed between the mounting members 808, 812. The cable coupling portion 800 is electrically and physically coupled to the electrical cable 740. The latching member 804 extends from a first side of the spade lug 606 through the aperture 630 to a second side of the spade lug 606 and engages the second side such that the latching member 804 holds the spade clip 710 on the spade lug 606. Further, the mounting members 808, 812 contact the second side of the spade lug 606 to hold the spade clip 710 on the spade lug 606.

Referring to FIGS. 4, 5, 7 and 15, the spade lug 606 of the interconnect member 310 is electrically and physically coupled to the spade clip 710, and the spade clip 710 is electrically and physically coupled to the electrical cable 740 when the adapter member 650 is at least partially disposed in the interior region 375 (shown in FIG. 4) of the plastic frame member 300. Further, the electrical cable 740 is electrically and physically coupled to the electrical connector 70.

The spade lug of the interconnect member 314 is electrically and physically coupled to the spade clip 714, and the spade clip 714 is electrically and physically coupled to the electrical cable 744 when the adapter member 650 is at least partially disposed in the interior region 375 of the plastic frame member 300. Further, the electrical cable 744 is electrically and physically coupled to the electrical connector 70.

The spade lug of the interconnect member 318 is electrically and physically coupled to the spade clip 718, and the spade clip 718 is electrically and physically coupled to the electrical cable 748 when the adapter member 650 is at least partially disposed in the interior region 375 of the plastic frame member 300. Further, the electrical cable 748 is electrically and physically coupled to the electrical connector 70.

The spade lug of the interconnect member 322 is electrically and physically coupled to the spade clip 722, and the spade clip 722 is electrically and physically coupled to the electrical cable 752 when the adapter member 650 is at least partially disposed in the interior region 375 of the plastic frame member 300. Further, the electrical cable 752 is electrically and physically coupled to the electrical connector 70.

The spade lug of the interconnect member 326 is electrically and physically coupled to the spade clip 726, and the spade clip 726 is electrically and physically coupled to the electrical cable 756 when the adapter member 650 is at least partially disposed in the interior region 375 of the plastic frame member 300. Further, the electrical cable 756 is electrically and physically coupled to the electrical connector 70.

The spade lug of the interconnect member 330 is electrically and physically coupled to the spade clip 730, and the spade clip 730 is electrically and physically coupled to the electrical cable 760 when the adapter member 650 is at least partially disposed in the interior region 375 of the plastic frame member 300. Further, the electrical cable 760 is electrically and physically coupled to the electrical connector 70.

Referring to FIGS. 1, 4, 16, 19 and 20, the plastic cover plate 772 is configured to cover the second side 775 of the adapter member 650 when the first side 774 of the adapter member 650 is disposed against the first side 400 (shown in FIG. 4) of the plate portion 370 of the plastic frame member 300, and the adapter member 650 is disposed in the interior region 375. The plastic cover plate 772 includes a plate portion 800 and side walls 802, 804, 806, 810. In an exemplary embodiment, the plate portion 800 is substantially rectangular shaped and includes an aperture 820 extending therethrough. The side walls 802, 804, 806, 810 are coupled to and extend outwardly from the plate portion 800 in a first direction. The side walls 802, 804 extend substantially parallel to one another. Also, the side walls 806, 810 extend substantially parallel to one another. The side wall 802 has the coupling tabs 812, 814 disposed thereon that are configured to removably engage portions of the coupling tabs 131, 133, 135 (shown in FIG. 15) to removably attach the plastic cover plate 772 to the frame members 20, 24, 28. Further, the sidewall 804 includes the coupling tabs 816, 818 disposed thereon that are configured to removably engage portions of the coupling tabs 132, 134, 136 (shown in FIG. 16) to removably attach the plastic cover plate 772 to the frame members 20, 24, 28.

Referring to FIGS. 9-13, the battery cell interconnect and voltage sensing assembly 122 in accordance with an exemplary embodiment will now be described. The assembly 122 includes a plastic frame member 900, an elongated interconnect member 910, interconnect members 914, 918, 920, 922, 926, 930, posts 932, 934, and a removable wire harness assembly 940.

The plastic frame member 900 is provided to hold the remaining components of the battery cell interconnect and voltage sensing assembly 122 thereon. The plastic frame member 900 includes a rectangular shaped plate 970, dividing walls 974, 976, 978, 980, 982, 984, 986, and attachment tabs 992, 994.

The rectangular shaped plate 970 has a first side 1000 and a second side 1002 that is disposed opposite to the first side 1000. The rectangular shaped plate 970 further includes elongated apertures 1010, 1014, 1018, 1020, 1021, 1022, 1026, 1030 extending therethrough. The elongated apertures 1010, 1014, 1018, 1020, 1021, 1022, 1026, 1030 extend substantially parallel to the longitudinal axis 950 of the plastic frame member 900. The elongated apertures 1010, 1014, 1018, 1020 are centered about an axis 952. The elongated apertures 1021, 1022, 1026, 1030 are centered about an axis 954. The axes 952, 954 are perpendicular to the longitudinal axis 950 and are disposed a longitudinal distance apart from one another.

Figure 10:
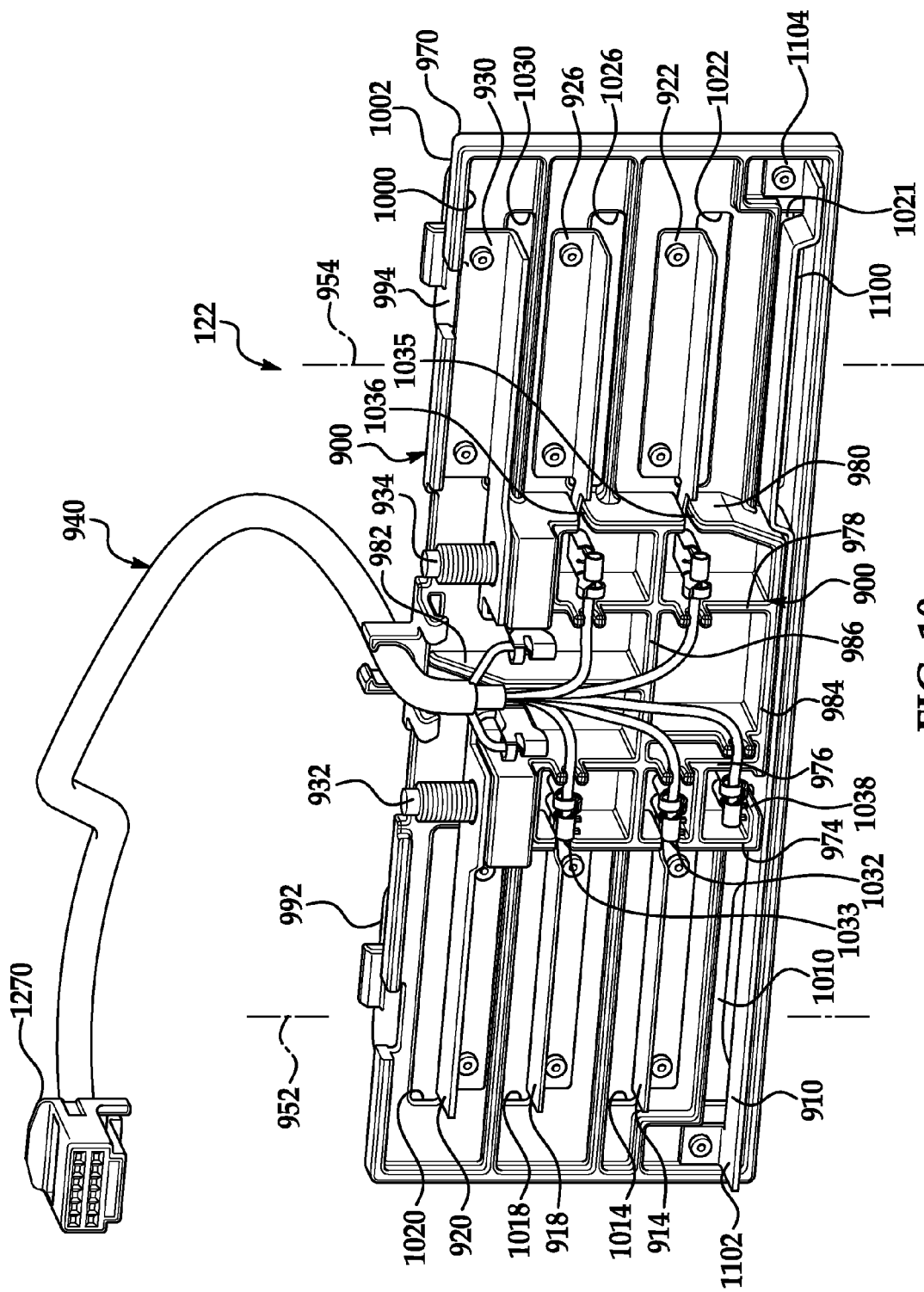
FIG. 10 is a schematic of a portion of the second battery cell interconnect and voltage sensing assembly of FIG. 9.
Figure 11:
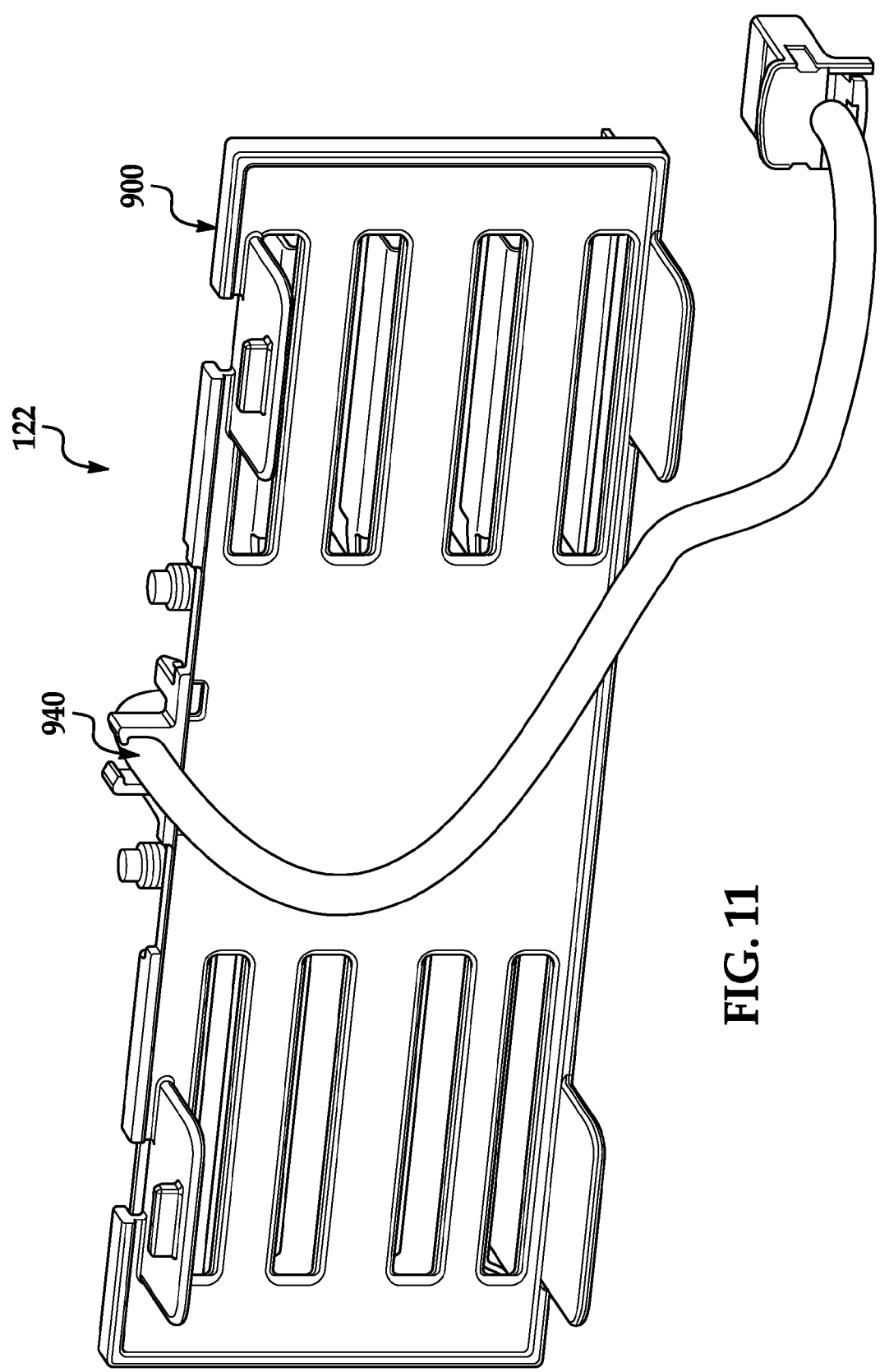
FIG. 11 is another schematic of a portion of the second battery cell interconnect and voltage sensing assembly of FIG. 9.
Figure 12:
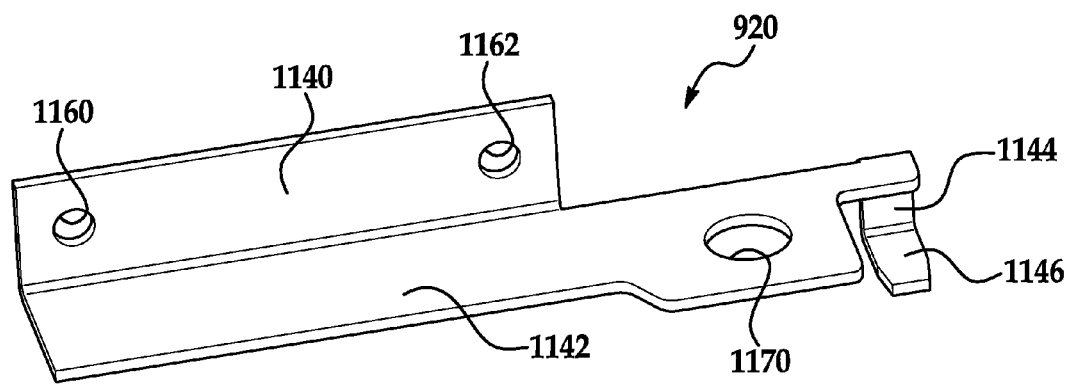
FIG. 12 is a schematic of an electrical connector utilized in the second battery cell interconnect and voltage sensing assembly of FIG. 9.
Figure 13:
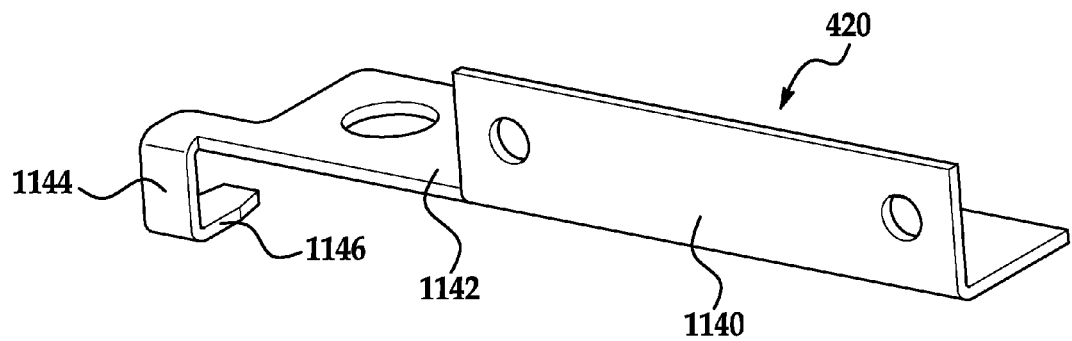
FIG. 13 is another schematic of the electrical connector of FIG. 12.
Figure 14:
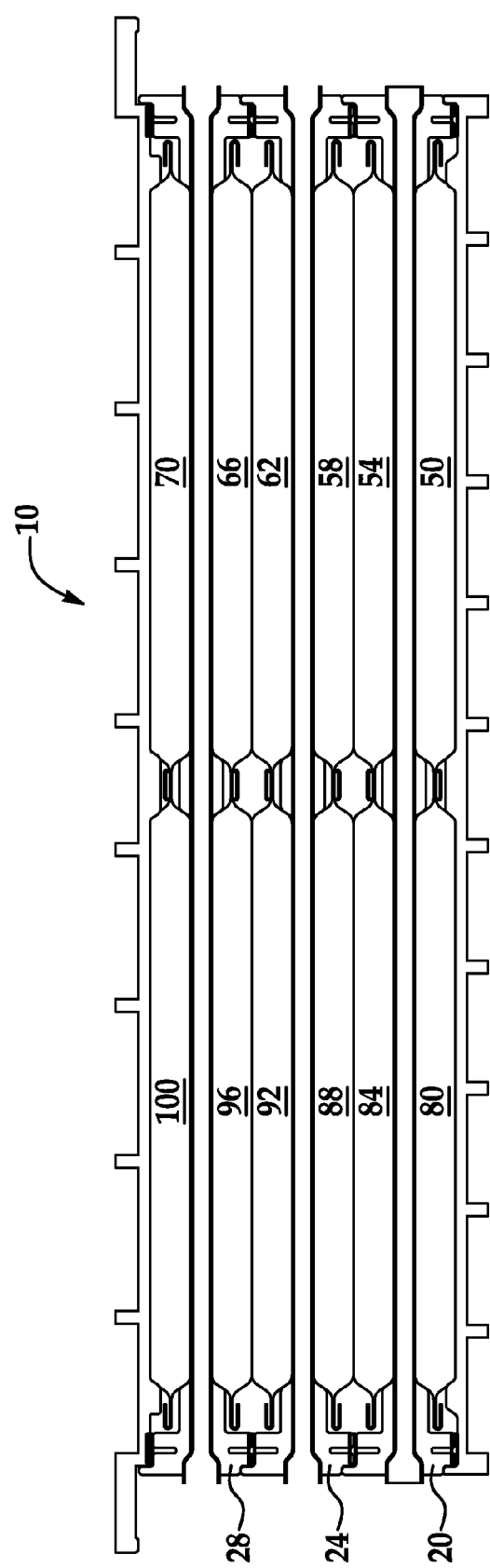
FIG. 14 is a cross-sectional schematic of a portion of the battery module of FIG. 1 taken along lines 14-14 of FIG. 1.

Referring to FIGS. 9 and 10, the dividing walls 974-986 extend outwardly from the first side 1000 of the rectangular shaped plate 970. The dividing walls 974-986 define interior regions 1040, 1042, 1044, 1046, 1048, 1050, 1052. As shown, the dividing walls 984, 986 extend substantially parallel to one another. Further, the dividing walls 974, 976, 978, 980, 982 extend substantially parallel to one another and perpendicular to the dividing walls 984, 986. The interior regions 1040, 1042, 1044, 1046, 1048, 1050, 1052 have the spade clips 1214, 1218, 1220, 1222, 1232, 1226, 1230, respectively, disposed therein.

The dividing wall 974 includes grooves 1032, 1033 extending therethrough for receiving portions of the interconnect members 914, 918, respectively, therethrough. The groove 1032 extends through the dividing wall 974 proximate to the interior region 1042. Further, the groove 1033 extends through the dividing wall 974 proximate to the interior region 1044.

The dividing wall 980 includes grooves 1035, 1036 extending therethrough for receiving portions of the interconnect members 922, 926, respectively, therethrough. The groove 1035 extends through the dividing wall 980 proximate to the interior region 1050. Further, the groove 1036 extends through the dividing wall 980 proximate to the interior region 1052.

The dividing wall 984 includes a groove 1038 extending therethrough for receiving a portion of the interconnect member 910 therethrough. The groove 1038 extends through the dividing wall 984 proximate to the interior region 1044.

The attachment tabs 992, 994 are provided to attach the battery cell interconnect and voltage sensing assembly 122 to the frame member 28. The attachment tabs 992, 994 are coupled to an end of the rectangular shaped plate 970 substantially perpendicular to the plate 970.

Referring to FIGS. 9 and 10, the elongated interconnect member 910 and the interconnect members 914, 918, 920, 922, 926, 930 are coupled to the first side 1000 of the rectangular shaped plate 970. Further, the interconnect members 914, 918, 920, 922, 926, 930 are disposed proximate to the elongated apertures 1014, 1018, 1020, 1022, 1026, 1030, respectively, in the rectangular shaped plate 970. In an exemplary embodiment, the interconnect members 910-930 are constructed from copper or nickel-plated copper. However, in alternative embodiments, the other electrically conducting materials can be used to construct the interconnect members 910-930. The interconnect members 914, 918, 922, 926 have an identical structure as the interconnect member 310 discussed above.

The elongated interconnect member 910 includes a plate member 1100, mounting tabs 1102, 1104, and a spade lug 1106. The mounting tabs 1102, 1104 are coupled to first and second ends of the plate member 1100 and extend substantially perpendicular to the plate member 1100. The mounting tabs 1102, 1104 have first and second apertures, respectively, extending therethrough for receiving tabs extending outwardly from the first side 1000 of the plastic frame member 900, for coupling the elongated interconnect member 910 to the plastic frame member 900. The spade lug 1106 is coupled to the plate member 1100. The elongated interconnect member 910 extends past the elongated apertures 1010, 1021 in the plastic frame member 900. The elongated interconnect member 910 is electrically and physically coupled to both electrical terminal 144 (shown in FIG. 2) of the battery cell 50 extending through the elongated aperture 1010, and the electrical terminal 204 (shown in FIG. 3) of the battery cell 80 extending through the elongated aperture 1021.

Referring to FIGS. 2, 9 and 10, the interconnect member 914 is coupled to the first side 1000 of the rectangular shaped plate 970 proximate to the elongated aperture 1014. The interconnect member 914 is electrically and physically coupled to the electrical terminals 154, 164 of the battery cells 54, 58, respectively. The interconnect member 914 is further electrically and physically coupled to the spade clip 1218.

The interconnect member 918 is coupled to the first side 1000 of the rectangular shaped plate 970 proximate to the elongated aperture 1018. The interconnect member 918 is electrically and physically coupled to the electrical terminals 174, 184 of the battery cells 62, 66 respectively. The interconnect member 918 is further electrically and physically coupled to the spade clip 1220.

Referring to FIGS. 2, 9, 10 and 12, the interconnect member 920 is coupled to the first side 1000 of the rectangular shaped plate 970 proximate to the elongated aperture 1020. The interconnect member 920 includes a first plate portion 1140, a second plate portion 1142, an extension portion 1144, and a spade lug 1146. The second plate portion 1142 is coupled to an edge of the first plate portion 1140 and extends substantially perpendicular to the first plate portion 1140. The extension portion 1144 is coupled to an end of the second plate portion 1142 and extends substantially perpendicular to the second plate portion 1142. The spade lug 1146 is coupled to an end of the extension portion 1144 and extends substantially perpendicular to the first plate portion 1140. The spade lug 1146 is configured to be removably electrically and physically coupled to the spade clip 1222.

The first plate portion 1140 includes apertures 1160, 1162 which receive first and second mounting tabs extending from the first side 1000 of the rectangular shaped plate 970 for coupling the first plate portion 1140 to the first side 1000 of the plate 970. The second plate portion 1142 is disposed proximate to the elongated aperture 1020 and is electrically and physically coupled to the electrical terminal 194 of the battery cell 70. The second plate portion 1142 includes an aperture 1170 extending therethrough for receiving the post 932 therethrough. The interconnect member 920 is electrically coupled to the post 932. The spade clip 1222 is removably attached to the spade lug 1146.

Referring to FIGS. 3, 9 and 10, the interconnect member 922 is coupled to the first side 1000 of the rectangular shaped plate 970 proximate to the elongated aperture 1022. The interconnect member 922 is electrically and physically coupled to the electrical terminals 214, 224 of the battery cells 84, 88 respectively. The interconnect member 922 is further electrically and physically coupled to the spade clip 1226.

The interconnect member 926 is coupled to the first side 1000 of the rectangular shaped plate 970 proximate to the elongated aperture 1026. The interconnect member 926 is electrically and physically coupled to the electrical terminals 234, 244 of the battery cells 92, 96 respectively. The interconnect member 1026 is further electrically and physically coupled to the spade clip 1230.

The interconnect member 930 has an identical structure as the interconnect member 920 discussed above. The interconnect member 930 is coupled to the first side 1000 of the rectangular shaped plate 970 proximate to the elongated aperture 1030. The interconnect member 930 is electrically and physically coupled to the electrical terminal 254 of the battery cell 100. The interconnect member 930 is further electrically and physically coupled to the spade clip 1232. The interconnect member 930 is further electrically coupled to the post 934.

Referring to FIGS. 1, 9 and 10, the removable wire harness assembly 940 is provided to route voltages from the interconnect members 910, 914, 918, 920, 922, 926, 930 to the battery management system 12. The removable wire harness assembly 940 includes spade clips 1210, 1214, 1218, 1222, 1226, 1230, 1232, electrical cables 1240, 1244, 1248, 1252, 1256, 1260, 1262 and an electrical connector 1270. The structure of the spade clips 1210-1232 are each identical to the spade clip 710 described above. The removable wire harness assembly 940 further includes an adaptor body and a plastic cover plate which have a similar structure as discussed above with respect to the adaptor body 650 and the plastic cover plate 772.

The spade lug of the elongated interconnect member 910 is electrically and physically coupled to the spade clip 1214, and the spade clip 1214 is electrically and physically coupled to the electrical cable 1240. Further, the electrical cable 1240 is electrically and physically coupled to the electrical connector 1270.

The spade lug of the interconnect member 914 is electrically and physically coupled to the spade clip 1218, and the spade clip 1218 is electrically and physically coupled to the electrical cable 1244. Further, the electrical cable 1244 is electrically and physically coupled to the electrical connector 1270.

The spade lug of the interconnect member 918 is electrically and physically coupled to the spade clip 1220, and the spade clip 1220 is electrically and physically coupled to the electrical cable 1248. Further, the electrical cable 1248 is electrically and physically coupled to the electrical connector 1270.

The spade lug of the interconnect member 920 is electrically and physically coupled to the spade clip 1222, and the spade clip 1222 is electrically and physically coupled to the electrical cable 1252. Further, the electrical cable 1252 is electrically and physically coupled to the electrical connector 1270.

The spade lug of the interconnect member 922 is electrically and physically coupled to the spade clip 1226, and the spade clip 1226 is electrically and physically coupled to the electrical cable 1256. Further, the electrical cable 1256 is electrically and physically coupled to the electrical connector 1270.

The spade lug of the interconnect member 926 is electrically and physically coupled to the spade clip 1230, and the spade clip 1230 is electrically and physically coupled to the electrical cable 1260. Further, the electrical cable 1260 is electrically and physically coupled to the electrical connector 1270.

The spade lug of the interconnect member 930 is electrically and physically coupled to the spade clip 1232, and the spade clip 1232 is electrically and physically coupled to the electrical cable 1262. Further, the electrical cable 1262 is electrically and physically coupled to the electrical connector 1270.

Referring to FIGS. 1, 2 and 3, during operation, the first and second battery cell interconnect and voltage sensing assemblies 120, 122 electrically couple the battery cells 50, 54, 58, 62, 66, 70, 80, 84, 88, 92, 96, 100 in series with one another. Further, the first and second battery cell interconnect and voltage sensing assemblies 120, 122 are electrically coupled to the battery management system 12. Thus, the battery management system 12 can measure operational voltages at specific electrical nodes in the battery cell circuit from the interconnect members 310, 314, 318, 322, 326, 330 of the assembly 120, and further receives voltages from the interconnect members 910, 914, 918, 920, 922, 926, 930 of the assembly 122, and can store values corresponding to operational voltages in a memory device. Further, the battery management system 12 can determine the state-of-charge and state-of-health of the associated battery cells based on the stored values. In an exemplary embodiment, the battery management system 12 includes a programmable computer therein.

The battery cell interconnect and voltage sensing assemblies and the battery module described herein provide a substantial advantage over other assemblies and modules. In particular, the battery cell interconnect and voltage sensing assemblies and battery module electrically utilize a removable wire harness assembly having an adapter member that holds spade clips therein for easily coupling the wire harness assembly to the battery module.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery cell interconnect and voltage sensing assembly, comprising:
    a plastic frame member having a plate portion and a central wall, the plate portion having first and second sides, the plate portion further having first and second elongated apertures extending therethrough, the central wall being coupled to and extending outwardly from the first side of the plate portion, the central wall being disposed between the first and second elongated apertures and defining an interior region;
    a first interconnect member being coupled to the plate portion on the first side thereof, the first interconnect member being configured to be electrically and physically coupled to a first electrical terminal of a first battery cell extending through the first elongated aperture, the first interconnect member having a spade lug, the spade lug of the first interconnect member being disposed in the interior region;
    a second interconnect member being coupled to the plate portion on the first side thereof, the second interconnect member being configured to be electrically and physically coupled to a first electrical terminal of a second battery cell extending through the second elongated aperture, the second interconnect member having a spade lug; the spade lug of the second interconnect member being disposed in the interior region;
    a removable wire harness assembly having an adaptor body, first and second spade clips, and first and second electrical cables; the adapter member having first and second sides and further having first and second apertures extending therethrough, the first spade clip being disposed in the first aperture of the adapter member, the second spade clip being disposed in the second aperture of the adapter member;
    the first spade clip being electrically and physically coupled to the spade lug of the first interconnect member when the adapter member is at least partially disposed in the interior region, the first spade clip being further electrically and physically coupled to the first electrical cable; and
    the second spade clip being electrically and physically coupled to the spade lug of the second interconnect member when the adapter member is at least partially disposed in the interior region, the second spade clip being further electrically and physically coupled to the second electrical cable.

2. The battery cell interconnect and voltage sensing assembly of claim 1, wherein the adapter member is sized and shaped to be received within the interior region defined by the central wall.

3. The battery cell interconnect and voltage sensing assembly of claim 1, wherein the central wall includes first and second grooves extending therethrough, a portion of the first interconnect member extending through the first groove such that the spade lug of the first interconnect member is disposed in the interior region, a portion of the second interconnect member extending through the second groove such that the spade lug of the second interconnect member is disposed in the interior region.

4. The battery cell interconnect and voltage sensing assembly of claim 1, wherein adapter member includes first and second cable apertures extending therein for receiving portions of the first and second electrical cables, respectively, therein.

5. The battery cell interconnect and voltage sensing assembly of claim 1, further comprising a plastic cover plate configured to cover the second side of the adapter member when the first side of the adapter member is disposed against the first side of the plate portion of the plastic frame member.

6. A battery module, comprising:
    a first battery cell having a first housing and first and second electrical terminals extending outwardly from first and second ends, respectively, of the first housing;
    a second battery cell having a second housing and first and second electrical terminals extending outwardly from first and second ends, respectively, of the second housing;
    first and second frame members being configured to hold the first and second battery cells therebetween;
    a battery cell interconnect and voltage sensing assembly being coupled to the first and second frame members, the battery cell interconnect and voltage sensing assembly having a plastic frame member, first and second interconnect members, and a removable wire harness assembly;
    the plastic frame member having a plate portion and a central wall, the plate portion having first and second sides, the plate portion further having first and second elongated apertures extending therethrough, the central wall being coupled to and extending outwardly from the first side of the plate portion, the central wall being disposed between the first and second elongated apertures and defining an interior region;
    the first interconnect member being coupled to the plate portion on the first side thereof, the first interconnect member being configured to be electrically and physically coupled to the first electrical terminal of the first battery cell extending through the first elongated aperture, the first interconnect member having a spade lug, the spade lug of the first interconnect member being disposed in the interior region;
    the second interconnect member being coupled to the plate portion on the first side thereof, the second interconnect member being configured to be electrically and physically coupled to the first electrical terminal of the second battery cell extending through the second elongated aperture, the second interconnect member having a spade lug; the spade lug of the second interconnect member being disposed in the interior region;
    the removable wire harness assembly having an adaptor body, first and second spade clips, and first and second electrical cables; the adapter member having first and second sides and further having first and second apertures extending therethrough, the first spade clip being disposed in the first aperture of the adapter member, the second spade clip being disposed in the second aperture of the adapter member;
    the first spade clip being electrically and physically coupled to the spade lug of the first interconnect member when the adapter member is at least partially disposed in the interior region, the first spade clip being further electrically and physically coupled to the first electrical cable; and the second spade clip being electrically and physically coupled to the spade lug of the second interconnect member when the adapter member is at least partially disposed in the interior region, the second spade clip being further electrically and physically coupled to the second electrical cable.

7. The battery module of claim 6, wherein the adapter member is sized and shaped to be received within the interior region defined by the central wall.

8. The battery module of claim 6, wherein the central wall includes first and second grooves extending therethrough, a portion of the first interconnect member extending through the first groove such that the spade lug of the first interconnect member is disposed in the interior region, a portion of the second interconnect member extending through the second groove such that the spade lug of the second interconnect member is disposed in the interior region.

9. The battery module of claim 6, wherein adapter member includes first and second cable apertures extending therein for receiving portions of the first and second electrical cables, respectively, therein.

10. The battery module of claim 6, further comprising a plastic cover plate configured to cover the second side of the adapter member when the first side of the adapter member is disposed against the first side of the plate portion of the plastic frame member, the plastic cover plate configured to removably attached to the first and second frame members.

\* \* \* \* \*